(12) United States Patent
Naito et al.

(10) Patent No.: US 8,685,872 B2
(45) Date of Patent: Apr. 1, 2014

(54) LOW SOFTENING POINT GLASS COMPOSITION, BONDING MATERIAL USING SAME AND ELECTRONIC PARTS

(71) Applicant: Hitachi Chemical Company, Ltd., Tokyo (JP)

(72) Inventors: Takashi Naito, Funabashi (JP); Shinichi Tachizono, Narita (JP); Kei Yoshimura, Inba (JP); Yuji Hashiba, Narita (JP); Keiichi Kanazawa, Ome (JP); Shinji Yamada, Tsukuba (JP); Satoru Amou, Hitachi (JP); Hiroki Yamamoto, Hitachi (JP); Takuya Aoyagi, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/900,340

(22) Filed: May 22, 2013

(65) Prior Publication Data

US 2013/0333748 A1    Dec. 19, 2013

Related U.S. Application Data

(62) Division of application No. 12/687,142, filed on Jan. 14, 2010, now Pat. No. 8,470,723.

(30) Foreign Application Priority Data

Jan. 16, 2009  (JP) ................. 2009-007145
Jul. 28, 2009  (JP) ................. 2009-174883

(51) Int. Cl.
*C03C 3/21*    (2006.01)
*C03C 8/00*    (2006.01)
*C03C 8/08*    (2006.01)
*C03C 8/18*    (2006.01)

(52) U.S. Cl.
USPC ............. 501/46; 501/14; 501/19; 501/21; 501/24

(58) Field of Classification Search
USPC ............... 501/14, 15, 19, 21, 24, 46
See application file for complete search history.

(56) References Cited

U.S. PATENT DOCUMENTS

| 7,585,798 B2 | 9/2009 | Yoshida et al. |
| 2008/0164462 A1 | 7/2008 | Lee et al. |
| 2009/0199897 A1 | 8/2009 | Naito et al. |
| 2010/0151323 A1 | 6/2010 | Naito et al. |

FOREIGN PATENT DOCUMENTS

| JP | 07-069672 | 3/1995 |
| JP | 10-139478 | 5/1998 |
| JP | 2004-250276 | 9/2004 |
| JP | 2006-342044 | 12/2006 |
| JP | 2007-026877 | 2/2007 |
| JP | 2007-182347 | 7/2007 |
| JP | 2007-320822 | 12/2007 |
| JP | 2007-320823 | 12/2007 |
| JP | 2008-185852 | 8/2008 |
| KR | 2006-0032950 | 4/2006 |

OTHER PUBLICATIONS

Korean Official Action dated Sep. 2, 2011, for KR Application No. 10-2010-0003402.

*Primary Examiner* — Karl Group
*Assistant Examiner* — Elizabeth A Bolden
(74) *Attorney, Agent, or Firm* — Antonelli, Terry, Stout & Kraus, LLP.

(57) ABSTRACT

A low softening point glass composition, which is substantially free from lead, bismuth and antimony and comprises oxides of vanadium, phosphorous, tellurium and iron, a softening point of the composition being 380° C. or lower.

6 Claims, 4 Drawing Sheets

FIG. 8 ns as oxides are: vanadium oxide ($V_2O_5$) in 45 to 65% by
LOW SOFTENING POINT GLASS COMPOSITION, BONDING MATERIAL USING SAME AND ELECTRONIC PARTS

CLAIM OF PRIORITY

The present application claims priority from Japanese patent application serial No. 2009-7145, filed on Jan. 16, 2009 and No. 2009-174883, filed on Jul. 28, 2009, the contents of which are hereby incorporated by reference into this application.

This application is a Divisional application of prior application Ser. No. 12/687,142, filed Jan. 14, 2010, U.S. Pat. No. 8,470,723 the contents of which are incorporated herein by reference in their entirety.

FIELD OF THE INVENTION

The present invention relates to a low softening point glass composition suitable for sealing of electronic parts such as ceramic packages of ICs, quartz vibrators, image displays, etc, and a bonding material using the same and electronic parts.

BACKGROUND OF THE INVENTION

Electronic parts such as ceramic packages of ICs, quartz vibrators, image displays, etc have bed airtightly sealed with glass compositions having a softening point of 400° C. or lower. The glass compositions contain filler powder with a low thermal expansion so as to control a thermal expansion, in general. Glass compositions containing lead oxide as a main component have been used.

Due to environmental and safety regulations, materials containing harmful lead have been avoided. In plasma display panels (PDP), one of image display devices, lead free glass compositions whose main component is bismuth oxide have been employed as disclosed in Japanese Patent Pre-publication H10-139478 (Patent document No. 1). In electronic devices such as PDPs where a sealing temperature is relatively high such as 450 to 600° C. the lead free glass compositions containing bismuth oxide as the main component can be applied. However, in electronic devices such as IC ceramic packages or quartz vibrators where a sealing temperature is relatively low such as 420° C. or lower, the lead containing glass compositions are still employed. In order to lower the softening point of the lead containing glass compositions, fluorine is contained.

As lead free glass compositions having a softening point lower than that of the lead-free glass compositions, glass compositions there have been proposed in Japanese Patent Prepublication H07-69672 (Patent document No. 2), Japanese Patent Prepublication 2004-250276 (Patent document No. 3), Japanese Patent Prepublication 2006-342044 (Patent document No. 4), Japanese Patent Prepublication 2007-320822 (Patent document No. 5). The Patent document No. 2 discloses a glass composition whose main component is tin oxide. Patent documents No. 3 to 5 discloses glass compositions whose main component is vanadium oxide.

In recent years bismuth and antimony have been controlled as administrated substances, in addition to harmful lead. The glass compositions disclosed in patent document Nos. 1 and 4 contain bismuth, a glass composition disclosed in patent document No. 5 contains antimony, and glass compositions disclosed in patent document No. 2 and 3 do not contain lead, bismuth and antimony.

PATENT DOCUMENTS

Patent document No. 1; JPH10-139478
Patent document No. 2; JPH7-69672
Patent document No. 3; JP2004-250276
Patent document No. 4; JP2006-342044
Patent document No. 5; JP2007-320822

Recently, bismuth and antimony, in addition to lead, have taken up as administrated substances; these substances would be regulated similarly to lead in the feature. The glass compositions disclosed in patent document Nos. 1 and 4 contain bismuth and the glass composition disclosed in patent document No. 5 contains antimony. But, the glass composition disclosed in patent document Nos. 2 and 3 do not contain any of lead, bismuth and antimony.

When glass compositions disclosed in patent document No. 2 whose main component is tin oxide are heated in air, valence of tin changes from two to four, which deteriorates chemical stability such as moisture resistance and water resistance of the glass compositions. That is, it is hard to obtain airtight sealing with high reliability. Further, airtight sealing at 420° C. or lower is difficult to perform.

Although the glass compositions whose main component is vanadium oxide disclosed in patent document No. 3 can be used at a temperature of 400° C. or lower, a thermal expansion coefficient is quite large, and a large amount of low thermal expansion fillers such as expensive zirconium tungstate phosphate must be added. In addition, it is difficult to control thermal expansion. Further, a number of air bubbles may remain in the sealed portions so that airtightness of the sealed portions is insufficient.

SUMMARY OF THE INVENTION

It is an object of the present invention to provide a glass composition and a bonding material substantially free from lead, bismuth and antimony, which can be used at 400 or lower, preferably at 380° C. or lower. That is, the present invention provides a glass composition and a bonding material having a softening point of 380° C. or lower. The glass composition has a thermal expansion coefficient of $120 \times 10^{-7}$/° C. or lower over a temperature range of 25° C. to 250° C., preferably $100 \times 10^{-7}$/° C. or lower, and a softening point is 360° C. or lower. The present invention provides a bonding material employing the glass composition, which has a thermal expansion of $80 \times 10^{-7}$/° C. or less, or $(95 \text{ to } 120) \times 10^{-7}$/° C. over a temperature range of 25° C. to 250° C. It is another object to provide electronic parts to which the glass compositions or the bonding material is applied.

The feature of the present invention resides in that a low softening point glass composition is free from lead, bismuth and antimony and contains oxides of vanadium, phosphorous, tellurium and iron, and a softening point is 380° C. or lower. As the components for glass composition, at least one of manganese, zinc, tungsten, molybdenum and barium is contained. Composition ranges of the components in conversion as oxides are: vanadium oxide ($V_2O_5$) in 45 to 65% by weight, phosphorous oxide ($P_2O_5$) in 10 to 20% by weight, tellurium oxide ($TeO_2$) in 10 to 25% by weight, iron oxide ($Fe_2O_3$) in 5 to 15% by weight, and at least one of manganese oxide ($MnO_2$), barium oxide (BaO), tungsten oxide ($WO_3$), molybdenum oxide ($MoO_3$) and barium oxide (BaO) in a total amount of 0 to 10% by weight. A preferable thermal expansion over 25° C. to 250° C. is $100 \times 10^{-7}$/° C. or lower and a softening point of the glass composition is 360° C. or lower.

Further, the present invention provides a glass composition, which is free from lead, bismuth and antimony, and containing vanadium, phosphorous, tellurium, barium and tungsten or molybdenum, and furthermore contains oxides of iron or alkali metal, a softening point thereof being 380° C. or lower. A preferable range of the glass composition in conversion of oxides is vanadium oxide ($V_2O_5$) in 40 to 55% by weight, phosphorous oxide ($P_2O_5$) in 5 to 15% by weight, tellurium oxide ($TeO_2$) in 20 to 30% by weight, barium oxide (BaO) in 2 to 10% by weight, tungsten oxide ($WO_3$) in 0 to 15% by weight, molybdenum oxide ($MoO_3$) in 0 to 15% by weight, iron oxide ($Fe_2O_3$) in 0 to 8% by weight, alkali metal oxide ($R_2O$; R is alkali metal) in 0 to 5% by weight, wherein a total amount of $Fe_2O_3$ and $R_2O$ is 2 to 8% by weight. Preferably, the glass composition should have a softening point of 360° C. or lower, and a thermal expansion coefficient over 25° C. to 250° C. is $120 \times 10^{-7}/$° C. or lower.

In addition, the present invention provides a sealing material employing the above glass composition. The sealing material comprises powder of the glass composition, and powder of a filler, wherein the glass composition is 70 volume % or more and the filler powder is 30 volume % or less. A preferable average particle size of the filler is 30 μm or less. As filler materials, niobium oxide, tantalum oxide and/or their compounds. As the filler, phosphate tungsten zirconate is preferable. A thermal expansion of the glass composition should be $80 \times 10^{-7}/$° C. over 25° C. to 250° C. or less. More preferably, a thermal expansion over 25° C. to 250° C. should be $(95 \text{ to } 120) \times 10^{-7}/$° C.

The present invention provides an electrode material comprising metal powder and the glass composition. The metal powder is contained in a amount of 83 to 93% by volume of the total volume of the metal powder and the glass composition. The metal powder is made of silver, copper, aluminum or their alloys.

The present invention further provides a glass paste for sealing comprising the low softening glass composition, resin and a solvent. In order to adjust the thermal expansion coefficient, the paste may contain the filler powder. The resin having a boiling point higher than that of the solvent includes ethyl cellulose, nitro cellulose, polyethylene glycol, acrylic resin, etc. The resin that dissolves into the solvent controls viscosity of the paste. The resin can decompose or vaporize at relatively low temperatures. The solvent for dissolving the resin includes terpineol, diethylene glycol monobutyl ether, diethylene glycol, monobutyl ether acetate, butyl carbitol, etc.

The solvent is removed at a drying step. After the drying step, the resin remains in the paste and it binds glass powder. Thereafter the paste is heated to vaporize the resin at such a temperature that the glass composition does not soften and flow. Then the glass paste is calcined to effect softening and flow of the glass composition. That is, the evaporation of the resin should be completed before calcinations.

The present invention provides electronic parts having glass sealed portions, glass bonded portions or glass coated portions wherein the portions contain the above described glass compositions. The low softening glass composition can be widely applied to electronic parts such as IC ceramic packages, quartz vibrators, image display devices. Further, the glass composition can be applied to electronic parts wherein the electronic parts have electrodes composed of metal and glass. Examples of these electronic parts include image displays and solar cells.

According to embodiments of the present invention, it is possible to provide glass compositions, which is free from lead, bismuth and antimony, and a softening point of 380° C. or lower, preferably 360° C. or lower. By utilizing the glass composition, it is possible to provide a sealing material having a sealing temperature of 400° C. or lower, preferably 380° C. or lower. This low softening point glass composition can be applied to low temperature glass sealing, low temperature bonding, low temperature coating, electrode formation of various electronic parts so that products that satisfy environment and safety regulations are provided. Typical electronic parts are IC ceramic packages, quartz vibrators, image displays, solar cells, etc.

DETAILED DESCRIPTION OF THE PREFERRED EMBODIMENTS

The present invention will be explained in detail by reference to drawings.

The glass compositions containing lead oxide as a main component with a low softening point have heretofore been utilized for low temperature sealing, low temperature glass bonding, low temperature glass coating, etc for electronic parts. Recently, the materials containing lead are regulated and controlled for electronic parts applications because of environment and safety. In PDP wherein sealing temperature is relatively high such as 450 to 500° C., lead free glass compositions containing bismuth as a main component have already been used. However, in electronic parts such as IC ceramic packages or quarts vibrators, which need glass sealing, bonding and coating at 420° C. or lower, the glass compositions containing lead as a main component are still used.

Further, bismuth and antimony are taken up as administrated substances in addition to lead in recent years. Therefore, bismuth and antimony would be regulated as same as or similar to lead in the feature.

Under the above circumstances glass compositions substantially free from lead, bismuth and antimony having a softening point of 420° C. or lower, preferably 400° C. or lower have been demanded in various products. Normally, in sealing at 400° C. the softening point of the glass composition should be 380° C. Since a sealing temperature of 380° C. or lower is desired, the softening point of the glass composition should be 360° C. or lower.

As low softening point glass compositions free from lead, bismuth and antimony, glass compositions containing tin oxide have been proposed. However, it is difficult to carry out low temperature sealing at 420° C. or lower, and when it is heated in air moisture resistance and water resistance of the glass composition would be insufficient by virtue of valence change of tin. Therefore, the glass composition containing tin oxide as a main component does not have a practical use. Further, glass compositions free from lead, bismuth and antimony and containing vanadium oxide and tellurium oxide as main components, which is utilized at 400° C. or lower exhibit a quite large thermal expansion coefficient such as $130 \times 10^{-7}/°$ C. Thus, it is difficult to control the thermal expansion coefficient by adding low thermal expansion filler materials, and since the glass composition generates a large amount of air bubbles, high airtightness was not obtained. A thermal expansion coefficient of $120 \times 10^{-7}/°$ C. or lower, more preferably $100 \times 10^{-7}/°$ C. is desired.

The present inventors have studied low softening point glass compositions with high applicability, which can be sealed at a temperature of 400° C. or lower, without using lead, bismuth and antimony. As a result, the inventors succeeded to produce a low softening point glass composition having a softening point of 380° C. or lower, improved moisture resistance and low thermal expansion coefficient, in compromising environment and safety and properties.

The glass composition may contain at least oxides of vanadium, phosphorous, tellurium and iron. The glass composition may further contain at least one of oxides of manganese, zinc, tungsten, molybdenum and barium. A preferable composition in oxide conversion is $V_2O_5$ in 45 to 65% by weight, $P_2O_5$ in 10 to 20% by weight, $TeO_2$ in 10 to 25% by weight, $Fe_2O_3$ in 5 to 15% by weight, and at least on of $MnO_2$, ZnO, $WO_3$, $MoO_3$, and BaO in a total amount of 0 to 10% by weight.

If $V_2O_5$ is less than 45% by weight, the softening point would exceed 380° C., sealing at 400° C. or lower would be difficult. On the other hand, if the amount of $V_2O_5$ is more than 65% by weight, moisture resistance may be deteriorated.

If the amount of $P_2O_5$ is less than 10% by weight, crystallization of the glass composition tends to take place and softening and flowability at a temperature lower than 400° C. is not expected. On the other hand, if the amount of $P_2O_5$ exceeds 20% by weight, the softening point exceeds 380° C., sealing at 400° C. or lower becomes difficult.

If the amount of $TeO_2$ id less than 10% by weight, the composition tends to crystallize, and the softening point would not be 380° C. or lower. On the other hand, if an amount of $TeO_2$ exceeds 25% by weight, the thermal expansion coefficient exceeds $100 \times 10^{-7}/°$ C., which looses practical applicability of the glass composition.

If an amount of $Fe_2O_3$ is less than 5% by weight, good moisture resistance is not expected. On the other hand, if the amount exceeds 15% by weight, the composition tends to crystallize, and softening and flowability at 400° C. or lower is not expected. If the total amount of $MnO_2$, ZnO, $WO_3$, $MoO_3$ and BaO exceeds 10% by weight, the composition tends to crystallize and good softening and flowability at 400° C. or lower is not expected. A preferable composition is $V_2O_5$ in 50 to 60% by weight, $P_2O_5$ in 15 to 20% by weight, $TeO_2$ in 15 to 25% by weight, $Fe_2O_3$ in 5 to 10% by weight, and at least one of $MnO_2$, ZnO, $WO_3$, $MoO_3$, and BaO in a total amount of 0 to 5% by weight.

The glass composition comprises oxides of vanadium, phosphorous, tellurium, barium and tungsten or molybdenum, and iron and/or alkali metal. A preferable composition in oxide conversion is $V_2O_5$ in 40 to 55% by weight, $P_2O_5$ in 5 to 15% by weight, $TeO_2$ in 20 to 30% by weight, BaO in 2 to 10% by weight, $WO_3$ in 0 to 15% by weight, $MoO_3$ in 0 to 15% by weight, $Fe_2O_3$ in 0 to 8% by weight, $R_2O$ (R is alkali metal) in 0 to 5% by weight, wherein a total amount of $Fe_2O_3$ and $TeO_2$ is 30 to 40% by weight, a total amount of $WO_3$ and $MoO_3$ is 5 to 15% by weight, a total amount of $Fe_2O_3$ and $R_2O$ is 2 to 8% by weight. If $V_2O_5$ is less than 40% by weight, the softening point would exceed 380° C., sealing at 400° C. or lower would be difficult. On the other hand, if $V_2O_5$ is larger than 55% by weight, good moisture resistance would not be expected.

If $PeO_5$ is less than 5% by weight, the composition tends to crystallize, and good softening and flowability is not expected. On the other hand, if $P_2O_5$ is larger than 15% by weight, the softening point exceeds 380° C., sealing at 400° C. or lower would be difficult.

If $TeO_2$ is less than 20% by weight, the composition tends to crystallize, and the softening point would not be lower than 380° C., sealing at 400° C. or lower would not be expected. On the other hand, if the amount of $TeO_2$ is larger than 30% by weight, the thermal expansion coefficient becomes too large, and moisture resistance would be deteriorated.

If an amount of BaO is less than 2% by weight, moisture resistance would be deteriorated. On the other hand, if the amount of BaO is larger than 10% by weight, the composition tends to easily crystallize, and the softening point and sealing temperature increased.

If $WO_3$ is larger than 15% by weight, the softening point and the sealing temperature increased. If $MoO_3$ is larger than 15% by weight, moisture resistance of the composition was deteriorated. If $Fe_2O_3$ is larger than 8% by weight, the composition tends to crystallize. $R_2O$ improves moisture resistance of the composition, but if the amount is larger than 5% by weight, the moisture resistance was deteriorated.

If the total amount of $P_2O_5$ and $TeO_2$ is less than 30% by weight, the composition tends to crystallize. On the other hand, if the total amount is larger than 40% by weight, the softening point and the sealing temperature increased. In addition, if the total amount of $Fe_2O_3$ and $R_2O$ is less than 2% by weight, good moisture resistance would not be expected. On the other hand, if the total amount is larger than 8% by weight, the composition tended to crystallize.

In the glass composition of the present invention the thermal expansion coefficient and flowability can be controlled by adding filler powder to the glass composition. Therefore, it is possible to apply the glass composition of the present invention to low temperature airtight sealing of a very wide fields including electronic parts of IC ceramic packages, quartz vibrators, image displays, etc. Further, the composition can be applied to electrodes of image displays or solar cells by adding metal powder to the composition.

Tables 1 to 3 show compositions and characteristics of low softening point glass compositions that were prepared and subjected to analysis by the inventors. The glass compositions are indicated in conversion of oxides shown in Table 1. The glass compositions do not contain any of lead, bismuth and antimony from the view-point of ecology and safety. As materials used for the glass compositions, vanadium was $V_2O_5$, phosphorous was $P_2O_5$, tellurium was $TeO_2$, iron was $Fe_2O_3$, manganese was $MnO_2$, zinc was ZnO, tungsten was $WO_3$, molybdenum was $MoO_3$, barium was $Ba(PO_3)_2$. In case $Ba(PO_3)_2$ was used, an amount of $P_2O_5$ was adjusted in consideration of barium material.

TABLE 1

| | Composition (% by weight) | | | | | | | | |
|---|---|---|---|---|---|---|---|---|---|
| No. | $V_2O_5$ | $P_2O_5$ | $TeO_2$ | $Fe_2O_3$ | $MnO_2$ | ZnO | $WO_3$ | $MoO_3$ | BaO |
| G1 | 65 | 20 | 15 | | | | | | |
| G2 | 65 | 20 | 10 | 5 | | | | | |
| G3 | 65 | 20 | | | 10 | | | | 5 |
| G4 | 65 | 20 | 5 | 5 | 5 | | | | |
| G5 | 65 | 20 | 5 | | 10 | | | | |
| G6 | 65 | 20 | 5 | | 7 | 3 | | | |

TABLE 1-continued

Composition (% by weight)

| No. | V$_2$O$_5$ | P$_2$O$_5$ | TeO$_2$ | Fe$_2$O$_3$ | MnO$_2$ | ZnO | WO$_3$ | MoO$_3$ | BaO |
|---|---|---|---|---|---|---|---|---|---|
| G7  | 65 | 20 | 5  |    | 5  |    | 5  |    |    |
| G8  | 60 | 20 |    |    | 10 | 10 |    |    |    |
| G9  | 60 | 20 |    | 5  | 10 |    |    |    | 5  |
| G10 | 60 | 20 |    |    | 15 |    |    |    |    |
| G11 | 60 | 20 | 10 |    | 10 |    |    |    |    |
| G12 | 60 | 20 | 10 | 5  | 5  |    |    |    |    |
| G13 | 60 | 15 | 20 | 5  |    |    |    |    |    |
| G14 | 60 | 20 | 10 | 10 |    |    |    |    |    |
| G15 | 60 | 15 | 25 |    |    |    |    |    |    |
| G16 | 55 | 10 | 25 | 10 |    |    |    |    |    |
| G17 | 55 | 15 | 20 | 10 |    |    |    |    |    |
| G18 | 55 | 20 | 15 | 10 |    |    |    |    |    |
| G19 | 55 | 25 | 10 | 10 |    |    |    |    |    |
| G20 | 55 | 20 | 5  |    | 15 |    |    |    |    |
| G21 | 55 | 15 | 20 |    | 5  |    |    |    | 5  |
| G22 | 55 | 15 | 20 |    |    | 5  |    |    | 5  |
| G23 | 55 | 15 | 20 | 5  |    |    |    |    | 5  |
| G24 | 55 | 15 | 20 |    | 10 |    |    |    |    |
| G25 | 55 | 20 | 15 |    | 5  |    |    |    | 5  |
| G26 | 55 | 20 | 15 |    | 10 |    |    |    |    |
| G27 | 55 | 10 | 20 | 10 | 5  |    |    |    |    |
| G28 | 55 | 10 | 20 | 10 |    | 5  |    |    |    |
| G29 | 55 | 15 | 20 | 5  |    |    | 5  |    |    |
| G30 | 55 | 15 | 20 | 5  |    |    |    |    |    |
| G31 | 55 | 15 | 20 | 5  |    |    | 5  | 5  |    |
| G32 | 55 | 15 | 20 |    |    | 5  | 5  |    |    |
| G33 | 55 | 15 | 20 | 5  | 5  |    |    |    |    |
| G34 | 52 | 22 |    | 8  |    |    | 5  |    | 15 |
| G35 | 50 | 15 | 20 | 15 |    | 3  |    |    |    |
| G36 | 50 | 15 | 25 | 10 |    |    |    |    |    |
| G37 | 50 | 20 | 20 | 10 |    |    |    |    |    |
| G38 | 50 | 20 | 20 | 5  |    | 5  |    |    |    |
| G39 | 50 | 15 | 20 |    | 10 |    |    | 5  |    |
| G40 | 50 | 20 | 5  |    | 25 |    |    |    |    |
| G41 | 50 | 20 | 10 |    | 10 | 5  |    |    | 5  |
| G42 | 50 | 15 | 20 | 5  |    |    | 5  |    | 5  |
| G43 | 48 | 22 |    | 10 |    | 3  |    |    | 15 |
| G44 | 45 | 20 | 20 | 10 |    |    | 5  |    |    |
| G45 | 45 | 15 | 20 | 5  | 5  | 5  |    |    | 5  |
| G46 | 45 | 20 | 20 | 5  |    | 5  |    | 5  |    |
| G47 | 45 | 25 |    | 10 |    | 5  |    |    | 15 |

TABLE 2

| Glass No. | Characteristic temperatures (° C.) | | | | Thermal expansion coefficient ($\times 10^{-7}$/° C.) |
|---|---|---|---|---|---|
|  | Tg | Mg | Ts | Tcry |  |
| G1  | 272 | 280 | 325 | 425 | 91 |
| G2  | 275 | 294 | 338 | 412 | 90 |
| G3  | 294 | 313 | 357 | 409 | 89 |
| G4  | 285 | 303 | 351 | 417 | 83 |
| G5  | 286 | 306 | 358 | 438 | 85 |
| G6  | 278 | 297 | 346 | 411 | 82 |
| G7  | 289 | 310 | 361 | 435 | 83 |
| G8  | 288 | 307 | 353 | 385 | 87 |
| G9  | 301 | 323 | 377 | 434 | 74 |
| G10 | 296 | 319 | 373 | 436 | 82 |
| G11 | 298 | 321 | 378 | 490 | 89 |
| G12 | 290 | 307 | 355 | 426 | 86 |
| G13 | 280 | 295 | 344 | 418 | 88 |
| G14 | 293 | 310 | 357 | 420 | 85 |
| G15 | 276 | 291 | 339 | 430 | 92 |
| G16 | 281 | 298 | 345 | 403 | 97 |
| G17 | 285 | 303 | 350 | 415 | 92 |
| G18 | 290 | 306 | 355 | 428 | 86 |
| G19 | 304 | 317 | 365 | 430 | 82 |
| G20 | 305 | 334 | 391 | 441 | 82 |
| G21 | 285 | 304 | 351 | 390 | 105 |
| G22 | 276 | 297 | 345 | 396 | 105 |
| G23 | 285 | 304 | 353 | 412 | 100 |
| G24 | 283 | 300 | 349 | 409 | 100 |
| G25 | 301 | 323 | 375 | >550 | 87 |
| G26 | 294 | 319 | 371 | 496 | 84 |
| G27 | 295 | 313 | 360 | 423 | 97 |
| G28 | 288 | 306 | 355 | 410 | 94 |
| G29 | 281 | 297 | 348 | 440 | 98 |
| G30 | 280 | 295 | 345 | 443 | 100 |
| G31 | 278 | 296 | 343 | 392 | 95 |
| G32 | 271 | 290 | 337 | 410 | 105 |
| G33 | 285 | 303 | 352 | 415 | 92 |
| G34 | 357 | 378 | 425 | >550 | 81 |
| G35 | 295 | 317 | 365 | 414 | 88 |
| G36 | 294 | 314 | 360 | 435 | 93 |
| G37 | 305 | 325 | 375 | >550 | 90 |
| G38 | 300 | 317 | 369 | >550 | 96 |
| G39 | 298 | 318 | 367 | 409 | 105 |
| G40 | 325 | 348 | 405 | 419 | 83 |
| G41 | 299 | 322 | 371 | 442 | 93 |
| G42 | 296 | 316 | 359 | 445 | 94 |
| G43 | 374 | 398 | 444 | >350 | 84 |
| G44 | 302 | 319 | 370 | 520 | 89 |
| G45 | 317 | 338 | 401 | 499 | 99 |
| G46 | 305 | 323 | 372 | >550 | 95 |
| G47 | 384 | 407 | 353 | >550 | 79 |

TABLE 3

| Glass No. | Button flow test | | Moisture resistance test | | | Evaluation |
|---|---|---|---|---|---|---|
|  | 380° C. | 400° C. | First day | Second day | Third day |  |
| G1  | ○ | ○ | X | X | X | X Comp. ex. |
| G2  | ○ | ○ | ○ | ○ | X | △ Example |
| G3  | ○ | ○ | X | X | X | X Comp. ex. |
| G4  | ○ | ○ | ○ | ○ | X | △ Example |
| G5  | ○ | ○ | X | X | X | X Comp. ex. |
| G6  | ○ | ○ | X | X | X | X Comp. ex. |
| G7  | ○ | ○ | X | X | X | X Comp. ex. |
| G8  | X | X | X | X | X | X Comp. ex. |
| G9  | △ | ○ | X | X | X | X Comp. ex. |
| G10 | △ | ○ | X | X | X | X Comp. ex. |
| G11 | △ | ○ | X | X | X | X Comp. ex. |
| G12 | ○ | ○ | ○ | ○ | ○ | ◎ Example |
| G13 | ○ | ○ | ○ | ○ | ○ | ◎ Example |
| G14 | ○ | ○ | ○ | ○ | ○ | ◎ Example |
| G15 | ○ | ○ | X | X | X | X Comp. ex. |
| G16 | ○ | ○ | ○ | ○ | ○ | ◎ Example |
| G17 | ○ | ○ | ○ | ○ | ○ | ◎ Example |
| G18 | ○ | ○ | ○ | ○ | ○ | ◎ Example |
| G19 | △ | ○ | ○ | ○ | ○ | ○ Example |
| G20 | X | △ | X | X | X | X Comp. ex. |
| G21 | ○ | ○ | X | X | X | X Comp. ex. |
| G22 | ○ | ○ | X | X | X | X Comp. ex. |
| G23 | ○ | ○ | ○ | ○ | ○ | ◎ Example |
| G24 | ○ | ○ | X | X | X | X Comp. ex. |
| G25 | △ | ○ | X | X | X | X Comp. ex. |
| G26 | △ | ○ | X | X | X | X Comp. ex. |
| G27 | ○ | ○ | ○ | ○ | ○ | ◎ Example |
| G28 | ○ | ○ | ○ | ○ | ○ | ◎ Example |
| G29 | ○ | ○ | ○ | ○ | ○ | ◎ Example |
| G30 | ○ | ○ | ○ | ○ | ○ | ◎ Example |
| G31 | ○ | ○ | ○ | ○ | ○ | ◎ Example |
| G32 | ○ | ○ | X | X | X | X Comp. ex. |
| G33 | ○ | ○ | ○ | ○ | ○ | ◎ Example |
| G34 | X | X | ○ | ○ | X | X Comp. ex. |
| G35 | △ | ○ | ○ | ○ | ○ | ○ Example |
| G36 | ○ | ○ | ○ | ○ | ○ | ◎ Example |
| G37 | △ | ○ | ○ | ○ | ○ | ○ Example |
| G38 | △ | ○ | ○ | ○ | ○ | ○ Example |

TABLE 3-continued

| | | | Moisture resistance test | | | |
|---|---|---|---|---|---|---|
| | Button flow test | | First | Second | Third | |
| Glass No. | 380° C. | 400° C. | day | day | day | Evaluation |
| G39 | Δ | ◯ | X | X | X | X Comp. ex. |
| G40 | X | Δ | X | X | X | X Comp. ex. |
| G41 | Δ | ◯ | X | X | X | X Comp. ex. |
| G42 | ◯ | ◯ | ◯ | ◯ | ◯ | ⊚ Example |
| G43 | X | X | ◯ | ◯ | X | X Comp. ex. |
| G44 | Δ | ◯ | ◯ | ◯ | ◯ | ◯ Example |
| G45 | X | Δ | ◯ | ◯ | ◯ | X Comp. ex. |
| G46 | Δ | ◯ | ◯ | ◯ | ◯ | ◯ Example |
| G47 | X | X | ◯ | ◯ | X | X Comp. ex. |

The low softening point glass compositions shown in Table 1 were prepared in the following manners. 150 to 200 g of mixed powder compositions were put in a platinum crucible and were heated at a temperature elevation speed at 5 to 10° C./min to 900 to 950° C. for one hour. During the heating time, the mixtures were kneaded to make the composition homogeneous.

The glass compositions were taken out from the crucible and flown into a graphite mold and onto a stainless steel plate, which were heated to about 150° C. in advance. The glass compositions flown onto the stainless steel plate were crushed to a particle size less than 20 μm. Diffraction thermal analysis (DTA) was conducted at a temperature elevation rate of 5° C./min. to measure such characteristic temperatures as transition temperature (Tg), yield point (Mg), softening point (Ts), and crystallization temperature (Tcry). As a standard sample, alumina powder was used.

In DTA curves Tg is a starting temperature of the first thermal peak, Mg is the first endothermic peak temperature, Ts is the second endothermic peak temperature, Tcry is the starting temperature of heat generation by crystallization. The thermal expansion coefficients (u) were measured in a temperature range of 25 to 250° C.

A sample for thermal expansion coefficient measurement was prepared as follows. After glass compositions were charged in a graphite mold, and the molding was subjected to annealing at temperatures of Tg to Mg. Then, the molding was machined into a cubic of 4×4×20 mm. The a was measured at a temperature elevation rate of 5° C./min with a thermal expansion coefficient meter. As a standard sample, a quartz glass column having a diameter of 5 mm×a length of 20 mm was used.

The softening flowability was evaluated by the button flow test. The samples for the test were prepared by grinding glass powder to a particle size of 20 μm or less, and press molding the glass powder into a diameter of 10 mm×a thickness of 5 mm. The molding was put on an alumina substrate and heated at a temperature elevation rate of 5° C./min to 380° C. and 400° C. for one hour, respectively. The softening flowability at 380° C. and 400° C. was evaluated as ◯, Δ and x, wherein ◯ means good flowability, Δ not good flowability but molding softened, and x not softened or crystallized.

The moisture resistance test was carried out for one day, two days and three days at 85° C. in 85% humidity. As the sample for the moisture resistance, the glass was cut into a cubic form of 4×4×20 mmm. In evaluation o means no change in appearance, and x change in appearance.

In total evaluation ⊚ means a thermal expansion coefficient of $100 \times 10^{-7}$/° C. or less, good flowability at 380° C. and 400° C., and good moisture resistance, ◯ the thermal expansion coefficient of $100 \times 10^{-7}$/° C. or less, good flowability at 400° C., and good moisture resistance, Δ the thermal expansion coefficient of $100 \times 10^{-7}$/° C. or less, good flowability at 380° C. and 400° C., and fairly good moisture resistance, x the thermal expansion coefficient larger than $100 \times 10^{-7}$/° C., flowability lower than 400° C. or insufficient moisture resistance.

As G2, 4, 12-14, 16-19, 23, 27-31, 33, 35-38, 42, 44 and 46 in Tables 1 and 1 show that the low softening glass compositions containing oxides of vanadium, phosphorous, tellurium and iron, and having a softening point of 380° C. or lower have the thermal expansion coefficient of $100 \times 10^{-7}$/° C. or less, good flowability at 400° C., and good moisture resistance.

The glass compositions may contain one or more other components such as oxides of manganese, zinc, tungsten, molybdenum and barium. Preferable compositions in conversion of oxides are $V_2O_5$ in 45 to 65% by weight, $P_2O_5$ in 10 to 20% by weight, $TeO_2$ in 10 to 25% by weight, $Fe_2O_3$ in 5 to 15% by weight, and a total amount of $MnO_2$, $WO_3$, $MoO_2$ and BaO in 0 to 10% by weight.

The glass compositions of G2, 4, 12-14, 16-18, 23, 27-31, 33, 36 and 42, which have a softening point of 360° C. or lower, good flowability at 380° C. Therefore, these glass compositions make it possible to carry out low temperature airtight sealing at 380° C. or lower. In addition, in considering moisture resistance, G12-14, 16-18, 23, 27-31, 33, 36 and 42 glass compositions are excellent. Therefore, preferable glass compositions in conversion of oxides are $V_2O_5$ in 50 to 60% by weight, $P_2O_5$ in 14 to 20% by weight, $TeO_2$ in 15 to 25% by weight, $Fe_2O_3$ in 5 to 10% by weight, a total amount of $MnO_2$, ZnO, $WO_3$, $MoO_2$ and BaO in 0 to 5% by weight.

Example 2

Kinds and amounts of fillers to be added to the glass compositions were investigated in example 2. As fillers used were cordierite having an average particle size of 30 μm, amorphous silica having an average particle size of 10 μm, zirconium silicate having an average particle size of 25 μm, mullite having an average particle size of 40 μm, alumina having an average particle size of 5 μm, niobium oxide having an average particle size of 1 μm and tantalum oxide having an average particle size of 3 μm.

TABLE 4

| | Filler | Average particle size (pm) |
|---|---|---|
| F1 | Cordierite | 30 |
| F2 | Amorphous silica | 10 |
| F3 | Zirconium silicate | 25 |
| F4 | Mullite | 40 |
| F5 | Alumina | 5 |
| F6 | Niobium pentoxide | 1 |
| F7 | Tantalum pentoxide | 3 |

As low softening point glass compositions used were D17, 29 and 36 in Tables 1 to 3. These glass composition powders were ground and sieved to obtain glass powder having an average particle size of 3 μm so that the glass compositions soften at lower temperatures. Additive amounts of the fillers to the glass compositions were 0, 10, 20, 30, 40 and 50 volume %.

Figure 1:
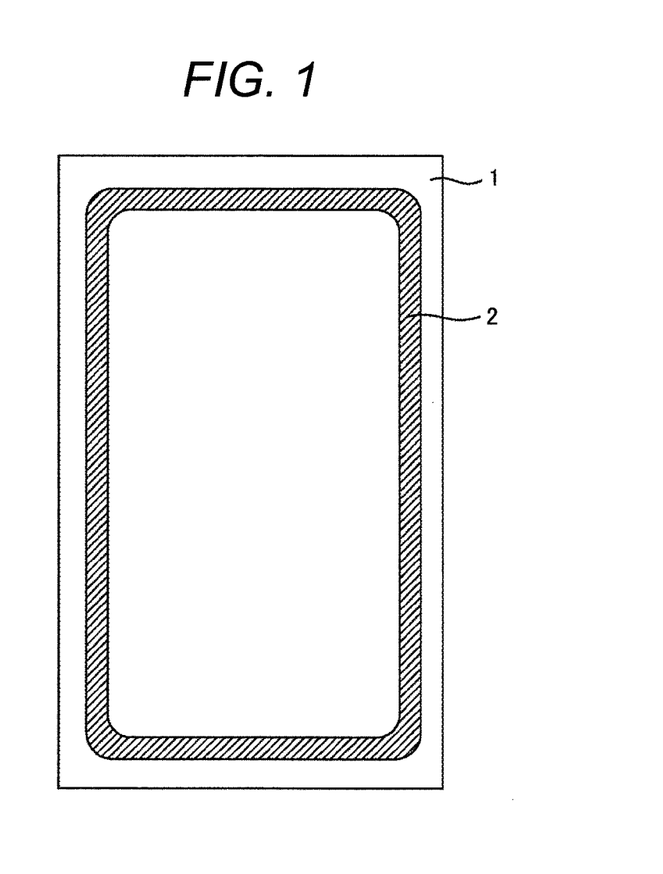
FIG. 1 is a top plan view of a sample substrate on which a sintered coating of a low softening glass composition was formed.
Figure 2:
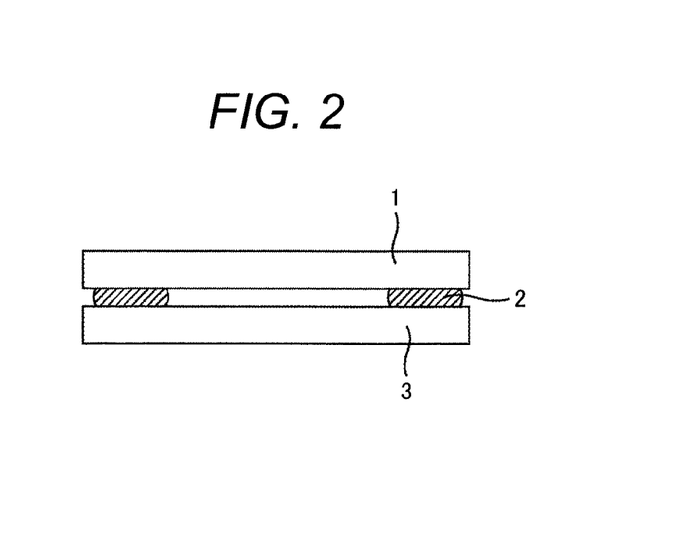
FIG. 2 is a cross sectional view of a sample sealing that used the substrate shown in FIG. 1.

Glass pastes were prepared by mixing the glass compositions and fillers, and a resin and a solvent were added to the mixtures. As the resin and as the solvent used were polyethylene glycol and α-terpineol, respectively. The glass pastes were coated on an alumina substrate 1 as shown in FIG. 1 and dried. Thereafter, glass coating film 2 were obtained by heating the coatings at a temperature elevation rate of 5° C./min to 380° C. for 10 minutes. A width of the coatings was 0.5 mm. Further, as shown in FIG. 2, the alumina substrate 1 having the glass coating 2 and an alumina substrate 3 having the same size were superposed, and a load was applied and heated to 360° C. for 10 minutes at a temperature elevation rate of 5° C./min thereby to seal them. The sealed bodies were subjected to evaluation of airtightness, bondability and residual air bubbles.

The result of evaluation is shown in Table 5.

TABLE 5

| Filler | Glass | Additive amount of filler (volume %) | | | | | |
|---|---|---|---|---|---|---|---|
| | | 0 | 10 | 20 | 30 | 40 | 50 |
| F1 | G17 | △ | ⊚ | ○ | △ | X | X |
|    | G29 | △ | ⊚ | ○ | △ | X | X |
|    | G36 | △ | ⊚ | ○ | △ | X | X |
| F2 | G17 | △ | ⊚ | ○ | △ | X | X |
|    | G29 | △ | ⊚ | ○ | △ | X | X |
|    | G36 | △ | ⊚ | ○ | △ | X | X |
| F3 | G17 | △ | ⊚ | ○ | △ | X | X |
|    | G29 | △ | ⊚ | ○ | △ | X | X |
|    | G36 | △ | ⊚ | ○ | △ | X | X |
| F4 | G17 | △ | ○ | △ | △ | X | X |
|    | G29 | △ | ○ | △ | △ | X | X |
|    | G36 | △ | ○ | △ | △ | X | X |
| F5 | G17 | △ | ⊚ | ○ | ○ | X | X |
|    | G29 | △ | ⊚ | ○ | ○ | X | X |
|    | G36 | △ | ⊚ | ○ | ○ | X | X |
| F6 | G17 | △ | ⊚ | ⊚ | ○ | △ | X |
|    | G29 | △ | ⊚ | ⊚ | ○ | △ | X |
|    | G36 | △ | ⊚ | ⊚ | ○ | △ | X |
| F7 | G17 | △ | ⊚ | ⊚ | ○ | △ | X |
|    | G29 | △ | ⊚ | ⊚ | ○ | △ | X |
|    | G36 | △ | ⊚ | ⊚ | ○ | △ | X |

In the evaluation ⊚ means airtightness, bondability and residual air bubbles are good, ○ good airtightness with small amount of residual air bubbles and good bondability, △ insufficient airtightness and residual air bubbles, but bondability was sufficient, and x insufficient bondability.

In any glass compositions and any fillers bondability was satisfactory when a volume % of glass compositions is 70% or more per the total volume of the glass+filler, i.e. a volume % of the filler is not more than 30%. Especially, when the volume % of the filler is not more than 20%, i.e. the volume % of the glass composition id not less than 80%, the airtightness, bondability and residual air bubbles were all good.

On the other hand, when the volume % of the filler exceeds 30% and the volume % of the glass composition is less than 70%, an amount of residual air bubbles increases, and good airtightness and bondability could not be obtained. Accordingly, the filler may be added by 30 volume % or less, or preferably 20 volume % or less to produce proper low temperature sealing materials. Without the filler, though the residual air bubbles and airtightness were good, but thermal expansion coefficients of the glass composition and the alumina substrate did not well match each other, which lead to cracks occurred in some cases. Therefore, in Table 5 evaluation was. In order to solve this problem, addition of the filler was effective to obtain a thermal expansion coefficient of $80 \times 10^{-7}/°C$.

It is apparent from Table 5 that when the average particle size of the filer is 30 μm or less, preferably 5 μm or less, good bondability was obtained. This may be because a thickness of the sealing can be made small. If niobium oxide or tantalum oxide fillers are used, an amount of residual air bubbles is quite small, which is particularly suitable for low temperature sealing material. This may be because niobium oxide and tantalum oxide are good at wettability with the glass composition. Compounds of these oxides may be usable.

The similar investigations on PDP glass substrates and silicon substrates were carried out. Regarding the resin and solvent, other materials such as polypropylene glycol, acrylate resins and butyl carbitol solvent were investigated to obtain the same results.

Example 3

In example 3 metal electrodes using the low softening point glass compositions will be explained. Generally, the electrodes are prepared by coating a paste comprising metal powder, resin and solvent, drying and calcining. In this example, as the low softening point glass composition, G36 shown in Tables 1 to 3 having an average particle size of 3 μm was used. As the metal powder, aluminum powder having an average particle size of 2 μm, as resin polyethylene glycol and as solvent α-terpineol were used. Volume ratios of the low softening point glass composition G36 to aluminum powder were 5:95, 7:93, 10:90, 17:83 and 25:75. Thus, 5 kinds of electrode pastes were prepared and investigated. The prepared pastes were coated on alumina substrates by a printing method, dried and heated to 400° C. for 30 minutes at a temperature elevation rate of 10° C./min to obtain aluminum electrodes.

As the amount of the glass powder of G36 in the aluminum electrodes formed on the alumina substrates increases, and as the amount of the aluminum powder in the aluminum electrode decreases, adhesion strength of the aluminum electrode to the alumina substrate increased. Although the adhesion strength was insufficient when the amount of G36 glass composition is 5 volume % and the amount of aluminum powder is 95 volume %, good adhesion strength was obtained when the volume of glass composition is 7 volume % or more and the amount of the aluminum powder is 93 volume % or less.

However, as the amount of the G36 glass powder increases and as the amount of the aluminum powder decreases, resistivity of the electrodes increased. Though it depends on applications of the electrodes, the amount of the aluminum powder should be 93 volume % or more for the electrodes. That is, a preferable amount of metal powder in the electrodes is 83 to 93 volume %.

Similarly to the above, silver electrodes and copper electrodes were investigated. As the silver electrodes, flake silver powder having an average particle size of 1 μm and flake copper powder having an average particle size of 3 μm were used. In forming the copper electrodes, the paste was treated in nitrogen atmosphere so as to avoid oxidation of copper. Both silver electrodes and copper electrodes formed on the alumina substrates exhibited similar results to the aluminum electrodes. It has been revealed that the low softening point glass compositions of the present invention are applicable to ones other than low temperature sealing.

Example 4

Figure 3:
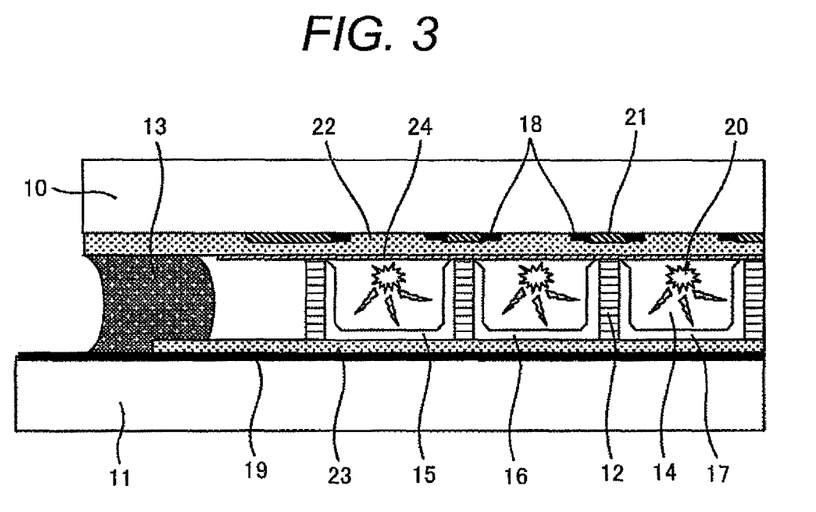
FIG. 3 is a cross sectional view of a typical plasma display panel.

Example 4 will be explained by reference to PDP to which the low softening glass composition of the present invention was applied. A diagrammatic cross sectional view of PDP is shown in FIG. 3.

A front panel 10 and a back panel 11 are opposed with a gap of 100 to 150 μm to constitute a PDP. The gap is maintained with partition walls 12. Peripheries of the front panel 10 and back panel 11 are airtightly sealed with sealing material 13, and rare gas is filled in the interior of the panels. The small spaces (cells 14) partitioned with the partition walls 12 are filled with fluorescence materials of red 15, green 16 and blue 17 to constitute pixels by three colors. Each pixel emits light of each color in accordance with signals.

The front panel 10 and the back panel 11 are provided with regularly arranged electrodes on their substrates. Display electrodes 18 of the front panel 10 and address electrodes 19 of the back panel 11 constitute pairs of electrodes between which a voltage of 100 to 200 V is selectively applied in accordance with display signals to thereby emit ultraviolet ray between the opposed electrodes. As a result, the fluorescent materials of red 15, green 16 and blue 17 are caused to emit respective light to display an image. The display electrodes 18 and address electrodes 19 are covered with dielectric layers 22, 23 so as to protect the electrodes and to control electric charges on the walls at the time of discharging.

The partition walls 12 are disposed on the dielectric layer 23 above the address electrodes 19 on the back plate 11 to thereby form cells 14. The partition walls 12 are stripe form or box form. In order to increase a contrast ratio, black matrixes (black strips) 21 are formed between display electrodes of adjacent cells.

As the display electrodes 18 and address electrodes 19, silver thick film wiring are generally used. For the purpose of countermeasure of silver migration, shift from silver to copper has been studied. For that purpose, oxidation prevention of copper is necessary. Though the display electrodes 18, address electrodes 19 and black matrixes 21 can be formed by a sputtering technique, a printing method is suitable to reduce a production cost. The dielectric layers 22, 23 can be formed by printing method in general.

The dielectric layer 22 is formed over the entire surface of the front panel 10 after the display electrodes and black matrixes 21 so as to perpendicularly cross the address electrodes 19 on the back panel 11. A protection layer 24 is formed on the dielectric layer 22 to protect the display electrode 18, etc from discharging. Generally, the protection layer 24 is made of evaporation film of MgO.

The partition walls 12 are made of a composite glass, which comprises a glass composition and a filler. The partition walls are sintered body of the composite glass. The partition walls 12 are formed by sticking a vaporizable sheet with slits onto the back panel 11, and a paste for the partition wall is filled in the slits. The paste is calcined at 500 to 600° C. to evaporate the sheet to thereby form the partition walls 12. The partition walls 12 can be formed by printing the paste over the entire one inner surface of the back panel 11, followed by drying, masking and mechanical etching or chemical etching to remove unnecessary portions. The remaining portions are calcined at 500 to 600° C.

The cells partitioned with the walls 12 are filled with red fluorescent paste 15, green fluorescent paste 16 and blue fluorescent paste 17, and the pastes are calcined at 400 to 500° C. to obtain red fluorescent material 15, green fluorescent material 16 and blue fluorescent material 17.

Generally, the front panel 10 and the back panel 11 are separately prepared and assembled to be opposed precisely. The peripheries are sealed with glass composition at 420 to 500° C. A sealing treatment at lower temperature is desired, however. The sealing material 13 is disposed to outer peripheries of one of the front panel 10 or the back panel 11 by a dispenser method or printing method. In general, the sealing material 13 is formed on the back panel 11 side. The sealing material 13 may be pre-calcined together with the fluorescent materials 15, 16, 17. By employing this method, air bubbles in the glass sealing are remarkably reduced to thereby produce glass sealing with high airtightness or high reliability. After the glass sealing, gas in the cells 14 are evacuated under heating and rare gas is filled in the cells and sealed the cells to complete the display panel.

In lighting the display panel a voltage is applied to crossing points between the display electrodes 18 and the address electrodes 19 to discharge the rare gas in the cells 14 to thereby form plasma. When the rare gas returns from the plasma state to the normal state, it emits ultraviolet ray to illuminate the red fluorescent material 15, green fluorescent material 16 and blue fluorescent material 17 to thereby light on the display panel. If a particular color display is turned on, address discharge between the display electrode 18 and the address electrode 19 of a cell 14 to be turned on is effected to accumulate wall charges in the cell. Then, a certain voltage is applied to a pair of display electrodes to turn on only the cells where the wall charges are accumulated by the address discharge, emitting ultraviolet ray 20 to illuminate the fluorescent materials to display images.

In this example, low temperature sealing pastes for low temperature sealing were prepared wherein the glass pastes comprise glass composition G36 in Tables 1 to 3, filler F5 in Table 4, polyethylene glycol, and solvent α-terpineol. A mixing ratio of G36 and F5 was 78:22 in volume. The composition was so adjusted that a thermal expansion coefficient becomes 70 to $75 \times 10^{-7}/°$ C. over a temperature range of 25 to 250° C. Since the thermal expansion coefficient of the glass substrates used as the front panel 10 and the back panel 11 were 80 to $85 \times 10^{-7}/°$ C., the thermal expansion coefficient of the sealing glass should be smaller by about 10 to 15% than that of the panel substrates so that a compression force is applied to the sealing glass 13.

Using the glass pastes, PDP shown in FIG. 3 was sealed at low temperatures. First, the low softening point glass paste was coated on the periphery of the back panel 11 by a dispenser method and dried. Thereafter, the sealing paste was heated to 400 for 30 minutes at a temperature elevation rate of 5° C./min. Then, the front panel 10 and the back panel 11 were accurately opposed and fixed with a clip. The assembled panels were evacuated to 350° C. for 2 hours at a temperature elevation rate of 5° C./min. Thereafter rare gas was filled in the spaces between the panels 10, 11, and the panels were cooled. Although the sealing temperature was remarkably lowered, compared to the conventional sealing, the panels could be airtightly sealed without any trouble. In turn-on tests of the panel, there was no problem. By lowering the sealing temperature, productivity of PDP was improved to reduce the production cost.

Example 5

Figure 4:
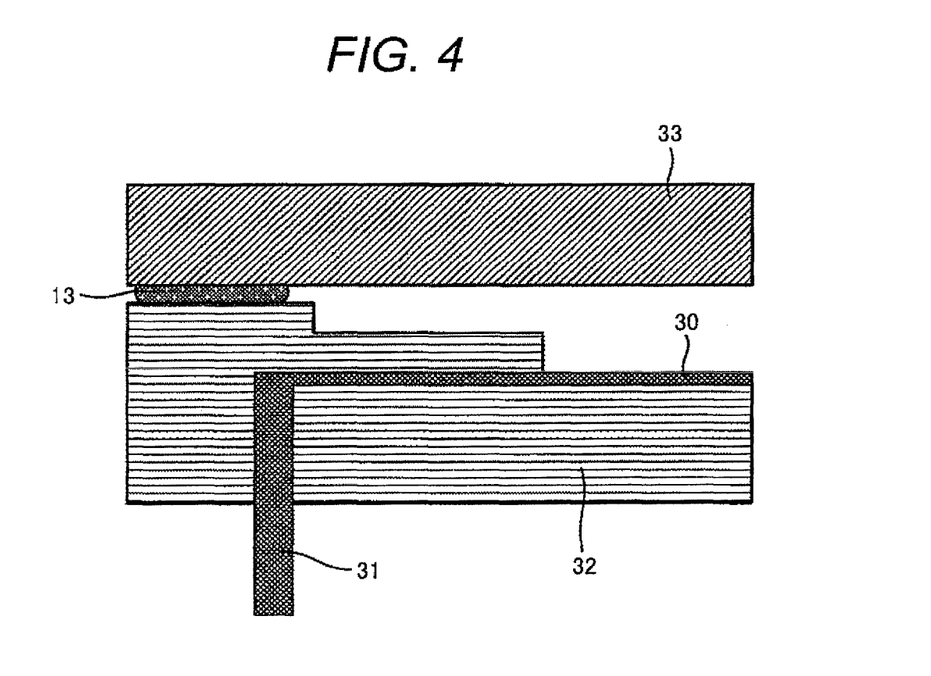
FIG. 4 is a cross sectional view of a typical ceramic package.

In example 5 the low softening point glass composition was applied to IC ceramic packages. A diagrammatic view of the IC ceramic package is shown in FIG. 4.

In IC ceramic packages a laminated ceramic substrate 32 having metal layer 30 and/or terminals 31 and ceramic cap 33 are airtightly sealed at peripheries thereof with sealing material 13. Generally, the sealing material 13 is coated on a periphery of the ceramic cap 33 by a printing method in glass sealing of IC ceramic packages. At this time, the sealing material 13 is used as a glass paste.

After drying the ceramic cap 33 coated with the sealing material 13, it was calcined in air. Using a fixing jig, the ceramic cap 33 with the sealing material 13 and the ceramic substrate 32 were opposed to each other. The assembly with the jig was subjected to sealing treatment in inert gas atmosphere under a load.

The conventional sealing material contained leas as a main component or further contains fluorine was used for airtight sealing at a temperature of 400° C. or lower, but such material as containing lead should be avoided in view of safety and environment.

In this example, IC packages using alumina ceramics were investigated. As the sealing material 13, G17 glass composition in Tables 1 to 3, as a filler F5 in Table 4, as the resin polyethylene glycol and as a solvent α-terpineol were employed to prepare the low softening point glass composition. A mixing ratio of G17 to F5 was 84:16 in volume. The thermal expansion coefficient of the calcined composition was $77 \times 10^{-7}$/° C. at a temperature range of 25 to 250° C. This low softening point glass paste was coated on the alumina ceramic cap 33 by a printing method. Then, the ceramic cap 33 was calcined in air by a two step profile. The first step heating of the two step profile was 330° C. for 20 minutes, and the second step heating was 380° C. for 10 minutes. The temperature elevation rate was 10° C./min.

Thereafter, the alumina ceramic cap 33 with the sealing material 13 and the alumina ceramic substrate 32 were opposed to each other with a fixing jig, and the assembly was heated to 370 for ten minutes in nitrogen atmosphere under a load at a temperature elevation rate of 10° C./min. In this manner ten ceramic packages were produced without any troubles. Any packages had no problem and could be sealed airtightly. Operation tests revealed that the ceramic packages have no problems. The IC ceramic packages after the operation test were disassembled to observe the sealing portion. Although there was a small amount of air bubbles in the sealing portion, it has high airtightness and high reliability.

The low softening point glass composition of the present invention can be applied to low temperature sealing of IC ceramic packages.

Example 6

Figure 5:
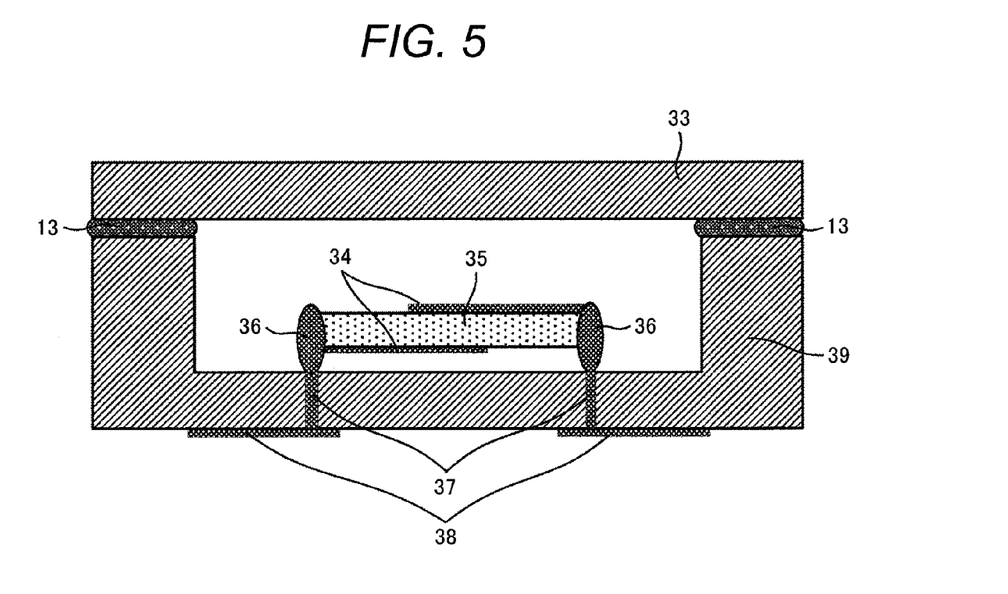
FIG. 5 is a cross sectional view of a typical quartz vibrator.

The low softening point glass composition of the present invention was applied to packaging of a quartz vibrator in this example. A diagrammatic sectional view of a quartz vibrator is shown in FIG. 5.

The quartz vibrator comprises a quartz thin plate 35 with electrodes 34 and a ceramic container 39, wherein the quartz thin plate 35 is bonded to terminals 37 with a conductive adhesive 36, and the terminals 37 are connected to electrode pads 38. Generally, the glass sealing material 13 is coated on outer peripheries of the ceramic cap 33 by a printing method. At this time, the sealing material 13 is used in a form of paste.

After drying the ceramic cap 33 coated with the sealing material, it is calcined in air. Using a fixing jig, the ceramic cap 33 and the ceramic container 39 are opposed to each other. The assembly with the jig was heated in inert gas atmosphere under a load to carry out glass sealing.

The conventional sealing material used for a low temperature sealing at 400° C. contains lead, and further contains fluorine; in view of safety and environment, such materials as containing harmful lead should be avoided.

A quartz vibrator using alumina ceramics was investigated in this example. As the sealing material G29 in Tables 1 to 3, as the filler F5 in Table 4, as the resin polyethylene glycol, and as the solvent α-terpineol were mixed to prepare a low softening point glass paste. A mixing ratio of G29 to F5 was 80:20 in volume. The thermal expansion coefficient of the glass paste after calcinations was $78 \times 10^{-7}$/° C. over a temperature range of 25 to 250° C. The low softening glass paste was coated on the alumina ceramic cap 33 by a printing method. Then, the ceramic cap 33 was calcined in air by a two step profile. The first step profile was carried out at 330° C. for 20 minutes and the second step profile was carried out at 390° C. for 10 minutes. A temperature elevation rate was 10° C./min.

Further, the alumina ceramic cap 33 with the sealing material 13 and the ceramic substrate container 39 were opposed to each other with a jig. The assembly was heated to 370° C. for 10 minutes in nitrogen atmosphere under a load to carry out the low temperature sealing. Ten quartz vibrators were produced without any troubles. Operation tests of the quartz vibrators revealed that they worked well. After the operation tests, a quartz vibrator was disassembled to observe the sealing portion. Although there was a small amount of air bubbles in the sealing potion, the quartz vibrators have good airtightness and high reliability.

The examples of the present invention have been explained with respect to low temperature sealing of PDP, IC ceramic packages and quartz vibrators; it is needless to say that the low softening point glass composition can be applied to other electronic parts, as well.

Example 7

Figure 6:
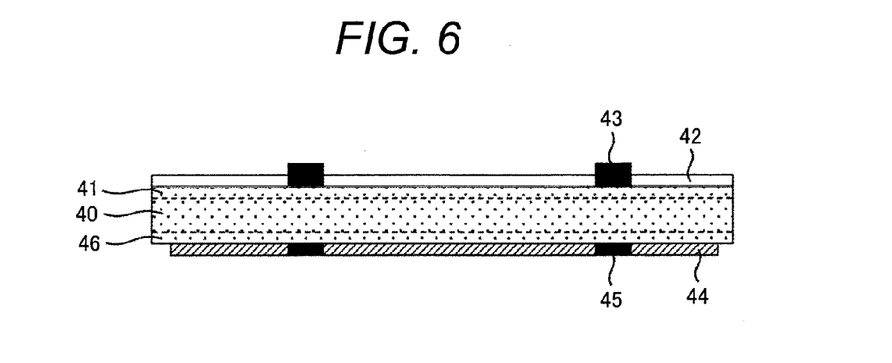
FIG. 6 is a cross sectional view of a typical solar cell.
Figure 7:
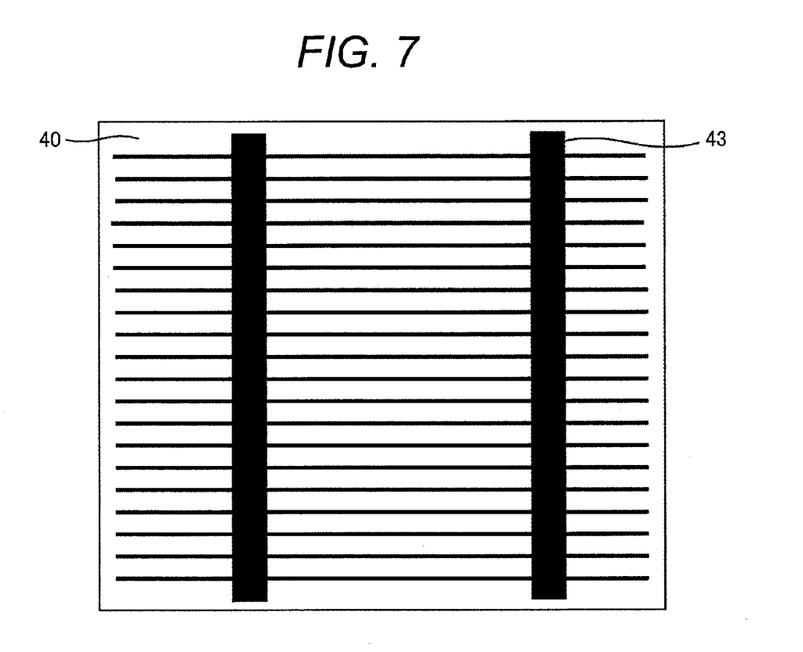
FIG. 7 is a plan view of a light receiving face of a typical solar cell.
Figure 8:
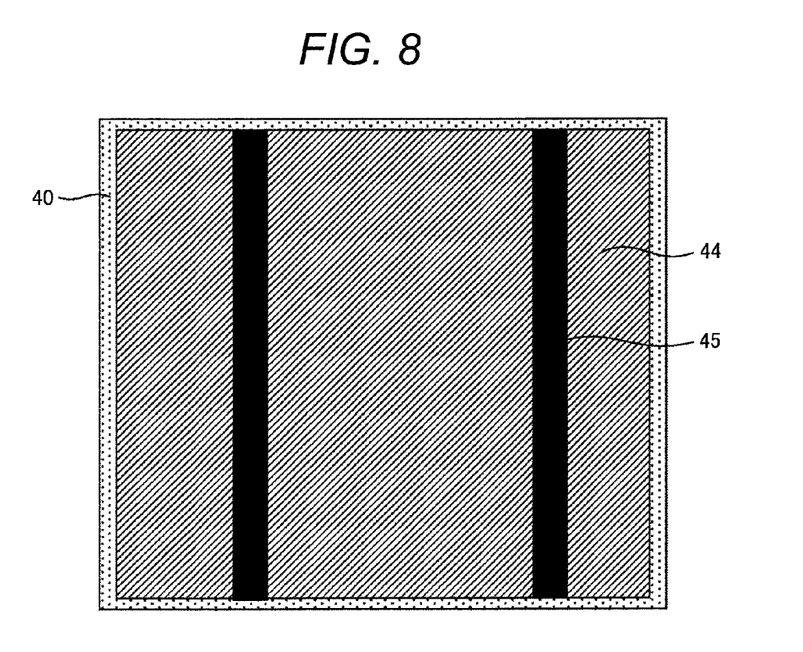
FIG. 8 is a back face of the solar cell shown in FIG. 7.

The glass composition of the present invention was applied to an electrode of a solar cell in this example. A cross sectional view, a light receiving plane and a rear face of a typical solar cell are shown in FIGS. 6, 7 and 8.

Generally, as a semiconductor substrate 40 of a solar cell, single or poly-crystalline silicon, etc is used. The semiconductor substrate 40 contains boron, etc as a p-type substrate.

The light receiving surface is provided with uneven face (fine projections) by etching so as to suppress reflection thereon. The light receiving surface is doped with phosphorous, etc to form n-type diffusion layer 41 with a submicron meter order. As a result, a pn-junction is formed at the interface with the p-type bulk portion. Further, an anti-reflection film 42 having a thickness of about 100 nm made of silicon nitride, etc is formed on the light receiving surface by evaporation, etc.

Formation of a light receiving electrode 43 to be formed on the light receiving surface, a collector electrode 44 and power pick-up electrode 45 is explained in the following. Generally, the light receiving electrode 43 and power pick-up electrode 45 are made from silver electrode paste containing glass composition powder, and the collector electrode 44 is made from aluminum electrode paste containing glass composition powder. The pastes are coated by screen printing method.

After drying, the pastes are calcined by a rapid heating furnace or laser heating to form the electrodes. At this time, the glass composition in the light receiving electrode 43 reacts with the anti-reflection film 42 to electrically connect the light receiving electrode 43 with the diffusion layer 41. In addition, aluminum in the collector electrode 44 diffuses into the rear face of the semiconductor substrate 40 to form electrode diffusion layer 46 to thereby form an ohmic contact among the semiconductor substrate 40, collector electrode 44 and power pick-up electrode 45.

Using the low softening glass composition G36 in Tables 1 to 3 silver pastes for the light receiving electrode 43 and the power pick-up electrode 45 were prepared. Using the low softening glass composition G17 in Tables 1 to 3, an aluminum electrode paste for the collector electrode 44 was prepared. An amount of the low softening glass composition in the paste was 10 volume % and an amount of silver or aluminum was 90 volume %, respectively.

An average particle size of the glass powder was about 1 μm. Silver and aluminum powders were prepared by mechanically crashing globular powder having 1 to 3 μm into plate like powders. As a resin binder, polyethylene glycol and as a solvent α-terpineol were used to prepare electrode pastes, which is usable for screen printing.

The aluminum electrode paste for the collector electrode 44 was coated, as shown in FIGS. 6 and 7, on the rear surface of the semiconductor substrate 40 by a screen printing method. After drying, the paste was heated by a rapid ultrared ray heating furnace in air at 400° C. for 10 minutes and, then, cooled thereby to form the collector electrode 44 on the rear face of the semiconductor substrate 40.

Thereafter, the silver electrode paste was coated on the light receiving surface having the diffusion layer 41 and the anti-reflection layer 42 of the semiconductor substrate 40 and the rear surface having the collector electrode of the semiconductor substrate 40 by a screen printing method, as shown in FIGS. 6, 7 and 8. Then, after the coating was dried, it was baked with a laser device.

In the resulting solar cell the light receiving electrode 43 and the semiconductor substrate 40 provided with the diffused layer were electrically connected in the light receiving surface. In addition, the electrode diffusion layer 46 was formed in the rear surface, and the ohmic contact was formed among the semiconductor substrate 40, collector electrode 44, and the power pick-up electrode 45. Further, it was possible to make the warp of the semiconductor substrate smaller than the conventional technique. According to a high humidity of 85% at high temperature test for 100 hours, increase in wiring resistance and contact resistance of the electrodes was not observed.

Accordingly, the low softening point glass compositions of the present invention are suitable for electrodes of solar cells. In addition, the glass composition of the present invention can be applied to electrode formation of electronic parts other than solar cells.

Example 8

Tables 6 to 8 show compositions and characteristics of low softening point glass compositions.

TABLE 6

| Glass No. | $V_2O_5$ | $P_2O_5$ | $TeO_2$ | BaO | $WO_3$ | $MoO_3$ | $Fe_2O_3$ | $R_2O$ |
|---|---|---|---|---|---|---|---|---|
| G48 | 60 | 10 | 25 | 5 | | | | |
| G49 | 60 | 10 | 25 | | 5 | | | |
| G50 | 55 | 10 | 20 | 5 | 10 | | | |
| G51 | 55 | 15 | 15 | 5 | 5 | | 5 | |
| G52 | 55 | 10 | 20 | 5 | 5 | | 5 | |
| G53 | 54 | 9 | 23 | 3 | 7 | | 4 | |
| G54 | 50 | 15 | 20 | 5 | 10 | | | |
| G55 | 50 | 10 | 25 | 5 | 5 | | 5 | |
| G56 | 50 | 11 | 20 | 4 | 10 | | 5 | |
| G57 | 50 | 10 | 25 | 5 | 8 | | 2 | |
| G58 | 50 | 10 | 25 | 2 | 5 | 3 | 5 | |
| G59 | 50 | 7 | 24 | 6 | 9 | | 4 | |
| G60 | 50 | | 35 | 10 | 5 | | | |
| G61 | 49 | 10 | 25 | 4 | 7 | | 5 | |
| G62 | 49 | 10 | 25 | 4 | | 7 | 5 | |
| G63 | 48 | 12 | 22 | 2 | 8 | | 8 | |
| G64 | 47 | 10 | 23 | 3 | 10 | 5 | 2 | |
| G65 | 47 | 9 | 24 | 7 | 10 | | | $K_2O$; 3 |
| G66 | 47 | 9 | 24 | 8 | 10 | | | $Na_2O$; 2 |
| G67 | 46 | 10 | 24 | 5 | 5 | 5 | 5 | |
| G68 | 45 | 15 | 24 | 4 | 5 | | 7 | |
| G69 | 45 | 12 | 25 | 5 | 9 | | 4 | |
| G70 | 45 | 7 | 28 | 5 | 8 | 3 | 3 | $K_2O$; 1 |
| G71 | 45 | 5 | 30 | 5 | 10 | | 5 | |
| G72 | 45 | 10 | 25 | 5 | 5 | | 10 | |
| G73 | 45 | 15 | 24 | 2 | 6 | | 3 | $K_2O$; 5 |
| G74 | 45 | 10 | 25 | 5 | 5 | 8 | | $K_2O$; 2 |

TABLE 6-continued

| Glass No. | $V_2O_5$ | $P_2O_5$ | $TeO_2$ | BaO | $WO_3$ | $MoO_3$ | $Fe_2O_3$ | $R_2O$ |
|---|---|---|---|---|---|---|---|---|
| G75 | 45 | 10 | 22 | 5 | 15 | | | $K_2O$; 3 |
| G76 | 45 | 15 | 15 | 5 | 18 | | 2 | |
| G77 | 45 | 10 | 23 | 3 | | 15 | 4 | |
| G78 | 45 | 10 | 20 | 5 | | 18 | 1 | $K_2O$; 1 |
| G79 | 45 | 15 | 15 | 5 | 9 | 9 | | $K_2O$; 2 |
| G80 | 45 | 10 | 25 | 5 | 10 | | | $K_2O$; 5 |
| G81 | 45 | 7 | 25 | 8 | 10 | | | $K_2O$; 5 |
| G82 | 45 | 12 | 25 | 5 | 10 | | | $K_2O$; 3 |
| G83 | 45 | 10 | 23 | 4 | 10 | | | $K_2O$; 8 |
| G84 | 40 | 15 | 25 | 7 | 10 | | | $K_2O$; 3 |
| G85 | 40 | 10 | 30 | 7 | 10 | | | $K_2O$; 3 |
| G86 | 40 | 12 | 25 | 10 | 10 | | | $K_2O$; 3 |
| G87 | 35 | 15 | 30 | 5 | 10 | | 5 | |

TABLE 7

| Glass No | Characteristic temperature (° C.) | | | | Thermal expansion coefficient ($\times 10^{-7}$/° C.) |
|---|---|---|---|---|---|
| | Tg | Mg | Ts | Tcry | |
| G48 | 268 | 282 | 320 | 415 | 96 |
| G49 | 272 | 288 | 324 | 435 | 93 |
| G50 | 299 | 324 | 372 | >550 | 98 |
| G51 | 294 | 319 | 355 | 385 | 92 |
| G52 | 286 | 302 | 353 | 418 | 97 |
| G53 | 285 | 305 | 349 | 425 | 96 |
| G54 | 293 | 316 | 367 | >550 | 102 |
| G55 | 279 | 305 | 345 | 415 | 103 |
| G56 | 288 | 312 | 355 | 398 | 95 |
| G57 | 280 | 301 | 344 | 408 | 108 |
| G58 | 290 | 306 | 355 | 385 | 105 |
| G59 | 282 | 302 | 352 | 393 | 102 |
| G60 | 274 | 295 | 336 | 373 | 152Δ |
| G61 | 285 | 307 | 350 | 413 | 102 |
| G62 | 280 | 302 | 342 | 408 | 107 |
| G63 | 293 | 325 | 354 | 410 | 96 |
| G64 | 299 | 325 | 375 | 432 | 104 |
| G65 | 277 | 302 | 345 | 495 | 117 |
| G66 | 273 | 290 | 333 | 446 | 120 |
| G67 | 282 | 300 | 347 | 425 | 100 |
| G68 | 303 | 331 | 377 | 465 | 98 |
| G69 | 298 | 312 | 360 | 447 | 96 |
| G70 | 292 | 315 | 360 | 435 | 110 |
| G71 | 285 | 301 | 351 | 400 | 120 |
| G72 | 297 | 315 | 362 | 375 | 97 |
| G73 | 303 | 321 | 370 | 530 | 126Δ |
| G74 | 289 | 310 | 347 | 423 | 109 |
| G75 | 297 | 328 | 380 | 466 | 110 |
| G76 | 332 | 359 | 411 | 486 | 88 |
| G77 | 302 | 330 | 379 | 437 | 105 |
| G78 | 315 | 340 | 390 | 456 | 107 |
| G79 | 324 | 350 | 403 | 486 | 98 |
| G80 | 277 | 300 | 340 | >550 | 143Δ |
| G81 | 270 | 290 | 327 | 396 | 147Δ |
| G82 | 285 | 307 | 347 | >550 | 118 |
| G83 | 265 | 282 | 315 | 525 | 159Δ |
| G84 | 310 | 333 | 378 | >550 | 120 |
| G85 | 291 | 305 | 357 | >550 | 136Δ |
| G86 | 312 | 334 | 360 | >550 | 116 |
| G87 | 330 | 358 | 395 | 535 | 98 |

TABLE 8

| Glass No. | Button flow test | | Moisture resistance test | | | Total evaluation |
|---|---|---|---|---|---|---|
| | 380° C. | 400° C. | 5 days | 10 days | 15 days | |
| G48 | ◯ | ◯ | X | X | X | X Comp. ex. |
| G49 | ◯ | ◯ | X | X | X | X Comp. ex. |
| G50 | ◯ | ◯ | ◯ | X | X | X Comp. ex. |

TABLE 8-continued

| Glass No. | Button flow test 380° C. | Button flow test 400° C. | Moisture resistance test 5 days | Moisture resistance test 10 days | Moisture resistance test 15 days | Total evaluation | |
|---|---|---|---|---|---|---|---|
| G51 | Δ | X | Δ | X | X | X | Comp. ex. |
| G52 | ○ | ○ | ○ | ○ | X | ○ | Example |
| G53 | ○ | ○ | ○ | ○ | X | ○ | Example |
| G54 | Δ | ○ | Δ | X | X | X | Comp. ex. |
| G55 | ○ | ○ | ○ | ○ | ○ | ◎ | Example |
| G56 | ○ | Δ | ○ | ○ | ○ | ○ | Example |
| G57 | ○ | ○ | ○ | ○ | X | ○ | Example |
| G58 | ○ | Δ | ○ | ○ | ○ | ○ | Example |
| G59 | ○ | Δ | ○ | ○ | ○ | ○ | Example |
| G60 | Δ | X | X | X | X | X | Comp. ex. |
| G61 | ○ | ○ | ○ | ○ | ○ | ◎ | Example |
| G62 | ○ | ○ | ○ | ○ | ○ | ◎ | Example |
| G63 | ○ | ○ | ○ | ○ | ○ | ◎ | Example |
| G64 | Δ | ○ | ○ | ○ | X | Δ | Example |
| G65 | ○ | ○ | ○ | ○ | ○ | ◎ | Example |
| G66 | ○ | ○ | ○ | ○ | ○ | ◎ | Example |
| G67 | ○ | ○ | ○ | ○ | ○ | ◎ | Example |
| G68 | Δ | ○ | ○ | ○ | X | Δ | Example |
| G69 | ○ | ○ | ○ | ○ | ○ | ◎ | Example |
| G70 | ○ | ○ | ○ | ○ | ○ | ◎ | Example |
| G71 | ○ | Δ | ○ | ○ | ○ | ○ | Example |
| G72 | X | X | ○ | ○ | ○ | X | Comp. ex. |
| G73 | Δ | ○ | ○ | ○ | X | ○ | Example |
| G74 | ○ | ○ | ○ | ○ | ○ | ◎ | Example |
| G75 | Δ | ○ | ○ | ○ | ○ | ○ | Example |
| G76 | X | X | ○ | ○ | ○ | X | Comp. ex. |
| G77 | Δ | ○ | ○ | ○ | ○ | ○ | Example |
| G78 | X | Δ | ○ | ○ | X | X | Comp. ex. |
| G79 | X | X | ○ | ○ | ○ | X | Comp. ex. |
| G80 | ○ | ○ | ○ | ○ | ○ | ○ | Example |
| G81 | ○ | Δ | ○ | ○ | ○ | ○ | Example |
| G82 | ○ | ○ | ○ | ○ | ○ | ◎ | Example |
| G83 | ○ | ○ | X | X | X | X | Comp. ex. |
| G84 | Δ | ○ | ○ | ○ | X | ○ | Example |
| G85 | ○ | ○ | ○ | ○ | ○ | ○ | Example |
| G86 | ○ | ○ | ○ | ○ | ○ | ◎ | Example |
| G87 | X | X | ○ | ○ | ○ | X | Comp. ex. |

The compositions shown in Table 6 represent % by weight in conversion to oxides. The glass compositions do not substantially contain lead, bismuth and antimony in view of safety and environment. As materials used for the glass compositions, vanadium was $V_2O_5$, phosphorous was $P_2O_5$, tellurium was $TeO_2$, barium was $BaCO_3$ or $Ba(PO_3)_2$, tungsten was $WO_3$, molybdenum was $MoO_3$, iron was $Fe_2O_3$, alkali metal R was $R_2O$. If $Ba(PO_3)_2$ is used, amount of $P_2O_5$ should be lowered accordingly.

The glass compositions shown in Tables 6-8 were prepared in the following manner. 200 grams of materials of the oxides was put in a platinum crucible, and was heated to 900° C. for one hour at a temperature elevation rate of 10° C./min. While the composition was held at 900° C., the composition was kneaded to make a homogeneous glass.

After the glass composition was taken out from the crucible, it was flown into a graphite mold and onto a stainless steel plate, which were heated to about 150 in advance. The glass composition flown onto the stainless steel plate was crushed into powder smaller than 20 μm. By the diffraction thermal analysis (DTA), transition temperature (Tg), yield point (Ng), softening point (Ts) and crystallization temperature (Tcry) were measured. As a standard sample, alumina powder was used.

In DTA curves Tg is a starting point of the first endothermic peak, Mg is the temperature of the first endothermic peak, the softening point (Ts) is the temperature of the second endothermic peak, crystallization temperature (Tcry) is a starting temperature of exothermic reaction.

The thermal expansion coefficient (α) was measured over a temperature rage of 25 to 250° C. Samples for thermal expansion coefficients were prepared from the glass composition flown into the graphite mold by subjecting annealing at Tg to Mg and cutting it into a cube of 4×4×20 mm. The thermal expansion coefficients were measured with a thermal expansion meter at a temperature elevation rate of 5° C./min. As a standard sample, a quartz column of a diameter of 5 mm×a length of 20 mm was used.

When the thermal expansion coefficients are too large, which needs careful handling, Δ is shown in the thermal expansion coefficient in Table 7.

Flowability of the glass composition at the time of heating was measured by a button flow test. Samples for the test were press-moldings each having a diameter of 10 mm and a thickness of 5 mm prepared from the glass powder ground into powder having a particle size of 20 μm or less. The moldings were put on an alumina substrate and heated to 380° C. and 400° C. for 10 minutes at a temperature elevation rate of 5° C./min to evaluate softening flowability at 380° C. and 400° C. The results are shown by ○, Δ and x. ○ means good flowability, Δ no good flowability, but softening was observed, and x no softening or crystallization observed.

Moisture resistance test was conducted under the conditions of 85° C., and humidity of 85% to evaluate after five days, ten days and 15 days. The conditions were severer than those of example 1. As the moisture resistance test samples, the same samples as in the thermal expansion coefficient measurement were used. Evaluation results are shown in Table 8, wherein ○ means no change in appearance and x change in appearance.

The total evaluation results are shown in Table 8, wherein ◎ means the thermal expansion coefficient of less than 120× $10^{-7}$/° C., good flowability at 380° C. and 400° C., and good moisture resistance, ○ fairly good flowability and moisture resistance, and x not good either one of flowability or moisture resistance.

As is apparent from G52, 53, 55-59, 61-71, 77, 80-82, 84-86 in Tables 6 to 8, glass compositions containing oxides of vanadium, phosphorous, tellurium, barium and tungsten or molybdenum, further iron or alkali metal and exhibiting a softening point of 380° C. or lower show good flowability at a temperature of 400° C. or lower and good moisture resistance.

A preferable range of the glass composition in conversion of oxides comprises: $V_2O_5$ in 40 to 55% by weight, $P_2O_5$ in 5 to 15% by weight, $TeO_2$ in 20 to 30% by weight, BaO in 2 to 10% by weight, $WO_3$ in 0 to 15% by weight, $MoO_3$ in 0 to 15% by weight, $Fe_2O_3$ in 0 to 8% by weight, $R_2O$ in 0 to 5% by weight, a total amount of $WO_3$ and $MoO_3$ in 5 to 15% by weight, and a total amount of $P_2O_5$ and $TeO_2$ in 30 to 40% by weight, a total amount of $Fe_2O_3$ and $R_2O$ in 2 to 8% by weight.

Further, G55, 61-63, 65-67, 69, 70, 74, 80-82, 85 and 86, which are the glass compositions having a softening point not higher than 360° C., exhibit good flowability at 360° C. and better moisture resistance. These glass compositions provided low temperature sealing with high reliability. However, since glass compositions G80, 81 and 85 have too large thermal expansion coefficients, which may be easily broken by thermal shock, careful handling of these compositions was needed.

If the thermal expansion coefficients are 120×$10^{-7}$/° C. or less, no such careful handling is almost necessary. In considering the thermal expansion coefficients, G55, 61-63, 65-67, 69, 70, 74, 82 and 86 are particularly suitable for low temperature sealing.

A more preferable composition comprises: $V_2O_5$ in 40 to 50% by weight, $P_2O_5$ in 7 to 12% by weight, $TeO_2$ in 22 to 28% by weight, BaO in 2 to 10% by weight, $WO_3$ in 0 to 10% by weight, $MoO_3$ in 0 to 8% by weight, $Fe_2O_3$ in 0 to 85 by weight, $R_2O$ in 0 to 3% by weight, a total amount of $P_2O_5$ and $TeO_2$ in 33 to 37% by weight, a total amount of $WO_3$ and $MoO_3$ in 5 to 13% by weight, and a total amount of $Fe_2O_3$ and $R_2O$ in 2 to 8% by weight.

Example 9

Using the low softening glass composition shown in Tables 6 to 8, i.e. G55, 61, 65, 80 and 82, investigations on fillers was conducted. These low softening point glass compositions exhibited good softening flowability at 380° C. and good moisture resistance as shown in example 8. As fillers niobium oxide having an average particle size of 1 μm, which was useful in example 2 was used. Further, zirconium tungustoidophosphate having an average particle size of 3 μm was also used.

The low softening glass compositions G55, 61, 65, 80 and 82 were finely ground and sheaved to obtain powder of an average particle size of 3 μm. Additive amounts of fillers to the glass compositions were 0, 10, 20, and 30 volume %. After mixing the glass compositions and fillers, resin and solvent were added thereto to prepare glass pastes. As the resin, ethyl cellulose and as the solvent butyl carbitol were added.

The glass pastes were coated on alumina substrates as shown in FIG. 1 and dried. Thereafter, the coatings were heated to 380° C. for 10 minutes at a temperature elevation rate of 5° C./min to form calcined glass coatings 2. A width of the coating was 0.5 mm. Further, the alumina substrate 1 having the calcined glass coating 2 and an alumina substrate 3 having the same shape as the alumina substrate 2 were assembled as shown in FIG. 2. The assembly was heated to 360° C. for 10 minutes under a load at a temperature elevation rate of 5° C./min to carryout the sealing. Resulting sealed assemblies were evaluated on airtightness, bondability and residual air bubbles.

In Table 9 ⊚ means good airtightness and bondability, and a small amount of residual air bubbles, little crack occurrence, ○ a small amount of residual air bubbles, good bondability and adhesion strength, Δ crack occurrence, but sealed and bonded without problem, and x insufficient airtightness and bondability due to residual air bubbles.

TABLE 9

| | | Amount of filler (vol. %) | | | |
|---|---|---|---|---|---|
| | Filler | 0 | 10 | 20 | 30 |
| G55 | Niobium pentoxide | Δ | Δ | ○ | ○○ |
| | Zirconium tungstate phosphate | Δ | ○ | ⊚ | ○○ |
| G61 | Niobium pentoxide | Δ | Δ | ○ | ○ |
| | Zirconium tungstate phosphate | Δ | ○ | ⊚ | ○ |
| G65 | Niobium pentoxide | x | Δ | ⊚ | ⊚ |
| | Zirconium tungstate phosphate | x | Δ | ⊚ | ⊚ |
| G80 | Niobium pentoxide | x | x | Δ | ⊚ |
| | Zirconium tungstate phosphate | x | Δ | ⊚ | ⊚ |
| G82 | Niobium pentoxide | x | Δ | Δ | ⊚ |
| | Zirconium tungstate phosphate | x | Δ | ⊚ | ⊚ |

In cases of G56, 65, 80 and 82 where the glass composition contains no filler, separation of the glass from the alumina substrate due to large difference in thermal expansion coefficients was observed. In case of G61, separation did not occur but cracks generated because the difference in thermal expansion coefficients was lowered.

All of the glass compositions contained very small amounts of residual air bubbles. Therefore, as long as the thermal expansion coefficients between the glass compositions and the alumina substrate meet each other, airtight bonding will be realized. As an amount of fillers increases, thermal expansion coefficients became smaller so that separation and cracks decreased.

Depending on thermal expansion coefficients of glass compositions, addition of fillers in 20 to 30 volume % prevented separation or cracks, which lead to good airtightness and bonding. In these cases addition of fillers such as zirconium tungstate phosphate was very effective.

In sealing and bonding of glass compositions to alumina substrates it is useful to adjust the thermal expansion coefficients to $80 \times 10^{-7}$/° C. over 25 to 250° C. by adding the filler.

With respect to PDP glass substrates similar investigation was made. As a result, results similar to the ones obtained in the alumina substrates were obtained. This is because a thermal expansion coefficient of the PDP glass substrate is almost the same as the alumina substrate.

In the following investigation of quartz substrates, which have a very large thermal expansion coefficient is explained. Evaluation results are shown in Table 10.

TABLE 10

| | | Amount of filler (vol. %) | | | |
|---|---|---|---|---|---|
| | Filler | 0 | 10 | 20 | 30 |
| G55 | Niobium pentoxide | ⊚ | ⊚ | Δ | x |
| | Zirconium tungstate phosphate | ⊚ | ⊚ | x | x |
| G61 | Niobium pentoxide | ⊚ | ⊚ | Δ | x |
| | Zirconium tungstate phosphate | ⊚ | ⊚ | x | x |
| G65 | Niobium pentoxide | ⊚ | ⊚ | ⊚ | x |
| | Zirconium tungstate phosphate | ⊚ | ⊚ | Δ | x |
| G80 | Niobium pentoxide | Δ | ⊚ | ⊚ | Δ |
| | Zirconium tungstate phosphate | Δ | ⊚ | ⊚ | Δ |
| G82 | Niobium pentoxide | ⊚ | ⊚ | ⊚ | x |
| | Zirconium tungstate phosphate | ⊚ | ⊚ | Δ | x |

In contrast to the alumina substrate, small amounts of fillers gave good airtightness and bondability. In case of G55, 61, 65 and 82, crack occurrence was not recognized. Despite of too large thermal expansion coefficient of G80, addition of a small amount of filler could prevent crack occurrence.

On the other hand, if an amount of filler is as large as 30 volume %, cracks and separation occurred because difference in thermal expansion coefficients became larger. However, an amount of residual air bubbles was not large. For the above reasons, it is effective to adjust the thermal expansion coefficient of glass composition containing filler to be $(95 \text{ to } 120) \times 10^{-7}$/° C. over a temperature range of 25 to 250° C. for sealing and bonding of quartz.

From the above analysis, the low softening point glass compositions of the present invention may contain the filler as much as 30 volume % so that thermal expansion coefficients are adjusted. Therefore, the glass compositions can be widely applied to low temperature sealing and low temperature bonding of various substrates.

Example 10

In example 10, as same as example 3, the low softening glass composition G82 in Tables 6 to 8 was applied to metal electrode.

In this example an average particle size of G82 was 3 μm. As metal powder, aluminum powder having an average particle size of 2 μm, as resin ethyl-cellulose and as solvent butylcarbitol were used.

The G82 glass composition powder and aluminum powder were nixed, and ethyl-cellulose and butylcarbitol were added to the mixture to prepare a paste for electrode. Mixing ratios of G82 to aluminum was 5:95, 7:93, 10:90, 17:83 and 25:75 by volume. Five kinds of pastes were prepared. The pastes were coated on glass substrates of PDP by a printing method, and dried. Thereafter, the coatings were heated to 400° C. for 30 minutes at a temperature elevation rate of 10° C./min to prepare aluminum electrodes.

The same results as in example 3 were obtained. Bondability to the substrates of aluminum electrodes formed on the PDP glass substrates increased as the amount of G82 glass powder increases. On the other hand, bondability to the substrate increased as the amount of aluminum powder decreased. Although bondability of the electrodes was insufficient when an amount of G82 is 5 volume % and an amount of aluminum powder is 95 volume %, good bondability was obtained when an amount of G82 is 7 volume % or more and an amount of aluminum powder is 93 volume % or less.

As the amount of glass compositions increases, or as the amount of aluminum powder decreases, electric resistivity of the electrode increased. Depending on applications of electrodes, an amount of aluminum powder should be at least 83 volume % for electrodes. That is, an amount of metal powder should be 83 to 93 volume % for the electrodes.

As same as above, silver electrode and copper electrode were investigated. Silver flake powder having an average particle size of 1 μm for silver electrode and copper lake powder having an average particle size of 3 μm for copper electrode were used. In case of copper electrode, heat treatment was conducted in nitrogen atmosphere so as to avoid oxidation of copper.

The same results as in aluminum electrodes were obtained in cases of silver electrode and copper electrode formed on PDP glass substrates. Thus, the low softening glass compositions are applicable to fields in addition to low temperature sealing.

Example 11

G65 glass composition in Tables 6 to 8 was applied to PDO in this example.

In this example, an average particle size of G65 was 3 μm. Zirconium tungstate phosphate having an average particle size of 3 μm, as a filler for lowering a thermal expansion coefficient, ethyl-cellulose and butylcarbitol were used. Powders of G65 and zirconium tungstate phosphate were mixed, and ethyl-cellulose and butylcarbitol were added to the mixture to prepare a low temperature sealing glass composition. A mixing ratio of G65 to zirconium tungstate phosphate was 75:25 by volume so that a thermal expansion coefficient after sealing was $75 \times 10^{-7}$/° C. over a temperature range of 25 to 250° C. That is, the thermal expansion coefficient of the sealing was made to close to that of PDP glass substrate.

As in the same as in example 4, PDP shown in FIG. 3 was sealed at low temperatures using the pastes prepared. At first, the paste was coated on the periphery of the back panel 11 by a dispenser method, and dried. After that, the paste was heated to 400 for 30 minutes at a temperature elevation rate of 5° C./min. Thereafter, the back panel 11 and the front panel 10 were opposed accurately to each other, and fixed with a clip. Evacuating the assembly, it was heated to 350° C. for 2 hours at a temperature elevation rate of 5° C./min, and then, rare gas was filled in the assembly, followed by cooling.

The PDP prepared showed the same results as in example 4. Despite that the sealing temperature was remarkably lowered, sealing could be performed without any troubles. Further, a lightning test of the PDP did not show any problems. Lowering of sealing temperature will contribute to increase in productivity of PDP and reduce a production cost.

G61 glass composition in Tables 6 to 8 was applied to low temperature sealing of IC ceramic package in this example.

IC ceramic packages using alumina ceramics as the ceramic container were investigated in this example. G61 has an average particle size of 3 μm. As a filler for lowering a thermal expansion coefficient of the sealing material, zirconium tungstate phosphate having an average particle size of 3 μm was used. Resin was ethyl-cellulose and solvent was butylcarbitol.

G61 powder and zirconium tungstate phosphate were mixed, and ethyl cellulose and butylcarbitol were added to the mixture to prepare low softening point glass compositions. A mixing ratio of G61 to zirconium tungstate phosphate was 85:15 by volume so that a thermal expansion coefficient of the sealing was $80 \times 10^{-7}$/° C. over a temperature range of 25 to 250° C.

Using the low softening glass paste, IC ceramic package shown in FIG. 4 was sealed at low temperatures, as same as in example 5. The glass paste was coated on the alumina ceramic cap 33. Thereafter, the ceramic cap 33 was calcined by two step profile, wherein the first step is 330° C. for 20 minutes and the second step is 380 for 10 minutes. A temperature elevation rate was 10/min.

Then, the alumina ceramic cap 33 provided with the sealing material 13 and an alumina ceramic container 32 were opposed with a fixing jig to each other. The assembly was heated to 370° C. for 10 minutes under a load at a temperature elevation rate of 10° C./min. In this manner, ten IC ceramic packages were prepared.

All IC ceramic packages could be glass-sealed and had no troubles as same as I example 5. An operation test proved that the IC ceramic packages had no problems. After the operation test, an IC ceramic package was disassembled to observe the sealing. There was a small amount of air bubbles, but the sealing had good airtightness with high reliability.

The glass composition of the present invention can be applied to low temperature sealing of IC ceramic packages.

Example 13

In this example, the glass composition G80 in Tables 6 to 8 was applied to low temperature sealing of a package of the quartz vibrator as the same as in example 6.

In this example packaging of quartz vibrators wherein quartz is used as a container was investigated. G80 had an average particle size of 3 μm. As a filler for lowering the thermal expansion coefficient, niobium pentoxide having an average particle size of 1 μm was used. The resin was ethyl cellulose and a solvent was butylcarbitol acetate.

G80 powder and niobium pentoxide were mixed, and ethyl cellulose and butyl carbitol acetate were added to the mixture to prepare low softening point glass compositions. A mixing ratio of G80 to niobium pentoxide was 75:25 by volume so that the sealing had a thermal expansion coefficient of $(115-120) \times 10^{-7}$/° C. over a temperature range of 25 to 250° C. The thermal expansion coefficient is as same as that of quartz.

Using the low softening point glass compositions, the quartz vibrator shown in FIG. 5 was subjected to low temperature sealing, as in the same manner as in example 6. The low softening glass paste was coated on a cap made of quartz by a printing method. Thereafter, the quartz cap was calcined in air by a two step profile, wherein the first step was 330° C. for 20 minutes and the second step was 390° C. for 10 minutes. A temperature elevation rate was 10° C./min.

Then, the quartz cap with the low softening point glass and a quartz container were opposed to each other by a fixing jig. The assembly was heated under a load to 370° C. in nitrogen gas at a temperature elevation rate of 10° C./min. According to this manner, ten quartz vibrators were manufactured without any troubles. Sealing could be performed airtightly. Operation tests were conducted to confirm good vibration performance. Quartz vibrators after the operation tests were disassembled to observe the sealing. Though there is a small amount of air bubbles, high airtightness and high reliability were attained.

The applications of the low softening point glass compositions to IC ceramic packages and quartz vibrators have been explained. It is needless to say the glass compositions of the present invention can be applied to other low temperature sealing of electronic parts.

Example 14

In this example, G65 and G82 in Tables 6 to 8 were applied to electrodes of a solar cell, as the same as in example 7.

In this example G65 and G82 were ground into powders having an average particle size of 1 μm. G65 glass powder was used for aluminum electrode and G82 glass powder was used for silver electrode. Resin was ethyl cellulose and solvent was butylcarbitol acetate.

The above were mixed to prepare electrode pastes. A mixing ratio of G65 to aluminum powder was 5:95 and a mixing ratio of G82 to silver powder was 10:90 by volume.

Using the aluminum electrode paste and the silver electrode paste, solar cells shown in FIGS. 6 to 8 were prepared. In the solar cells the light receiving electrode 43 and the semiconductor substrate 40 with the diffusion layer 41 are electrically connected in the light receiving surface. The electrode diffusion layer 46 is formed in the rear surface so that an ohmic contact between the semiconductor substrate 40 and the collector electrode 44 or the electric power pick-up electrode 45 is formed. Warp of the semiconductor substrate was lowered. Further, a high temperature-high humidity test at 85° C. in 85% humidity was conducted to find almost no increase in wiring resistance and contact resistance of the electrode.

Accordingly, the low softening point glass composition of the present invention may be applied to electrodes of solar cells. The glass compositions can be applied to electrode formation of electronic parts other than the solar cell.

Explanations of reference numerals: 1; alumina substrate, 2; calcined glass film, 10; front panel, 11; back panel, 12; partition wall, 13; sealing material, 14; cell, 15,16,17; red, green, blue fluorescent materials, 18; display electrode, 19; address electrode, 20; ultraviolet ray, 21; black matrix, 22, 23; dielectric layer, 24; protection layer, 30; metalized layer, 31; terminal, 32; laminated ceramic substrate, 33; ceramic cap, 40; semiconductor substrate, 41; diffusion layer, 42; anti-reflection layer, 43; light receiving electrode, 44; collector electrode, 45; power pick-up electrode, 46; electrode diffusion layer.

What is claimed is:

1. A low softening point glass composition, which is substantially free from lead, bismuth and antimony, and comprises oxides of vanadium, phosphorous, tellurium, barium, tungsten and/or molybdenum, and iron and/or alkali metal, the softening point of the glass composition being 380° C. or lower.

2. The low softening point glass composition according to claim 1, wherein vanadium, phosphorous, tellurium, barium, tungsten, molybdenum, iron, alkali metal are contained in conversion as oxides, an amount of $V_2O_5$ being in 40 to 55% by weight, $P_2O_5$ in 5 to 15% by weight, $TeO_2$ in 20 to 30% by weight, $BaO$ in 2 to 10% by weight, $WO_3$ in 0 to 15% by weight, $MoO_3$ in 0 to 15% by weight, $Fe_2O_3$ in 0 to 8% by weight, $R_2O$ (R; alkali metal) in 0 to 5% by weight, a total amount of $P_2O_5$ and $TeO_2$ being 30 to 40% by weight, a total amount of $WO_3$ and $MoO_3$ being 5 to 15% by weight, and a total amount of $Fe_2O_3$ and $R_2O$ being 2 to 8% by weight.

3. The low softening point glass composition according to claim 1, wherein the softening point of the glass composition is 360° C. or lower, and a thermal expansion coefficient of the glass composition over a temperature range of 25 to 250° C. is $120 \times 10^{-7}/°$ C. or lower.

4. An electronic part comprising an electronic component having an electrode, in contact with the electronic component, the electrode comprising metal and glass, wherein the glass is the low softening glass composition of claim 2.

5. The electronic part according to claim 4, wherein the electronic component is an image display.

6. The electronic part according to claim 4, wherein the electronic component is a solar cell.

* * * * *